United States Patent
Huo et al.

(10) Patent No.: US 10,431,662 B2
(45) Date of Patent: Oct. 1, 2019

(54) THIN FILM TRANSISTOR AND METHOD FOR MAKING THE SAME

(71) Applicants: Tsinghua University, Beijing (CN); HON HAI PRECISION INDUSTRY CO., LTD., New Taipei (TW)

(72) Inventors: Yu-Jia Huo, Beijing (CN); Yu-Dan Zhao, Beijing (CN); Xiao-Yang Xiao, Beijing (CN); Ying-Cheng Wang, Beijing (CN); Tian-Fu Zhang, Beijing (CN); Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/817,520

(22) Filed: Nov. 20, 2017

(65) Prior Publication Data
US 2018/0158921 A1 Jun. 7, 2018

(30) Foreign Application Priority Data

Dec. 7, 2016 (CN) .......................... 2016 1 1114659

(51) Int. Cl.
*H01L 29/423* (2006.01)
*H01L 21/02* (2006.01)
(Continued)

(52) U.S. Cl.
CPC ........ *H01L 29/42384* (2013.01); *C08L 67/02* (2013.01); *H01L 21/02266* (2013.01);
(Continued)

(58) Field of Classification Search
CPC ......... H01L 29/42384; H01L 29/66742; H01L 29/78603; H01L 29/24; H01L 29/0665;
(Continued)

(56) References Cited

U.S. PATENT DOCUMENTS

2003/0031296 A1* 2/2003 Hoheisel ............... G01T 1/2018
378/98.8
2010/0137143 A1* 6/2010 Rothberg ............. C12Q 1/6874
506/2
(Continued)

FOREIGN PATENT DOCUMENTS

JP 2004158498 * 3/2004 ............ H01L 29/78
JP 2004-158498 A 6/2004
(Continued)

OTHER PUBLICATIONS

Li et al. Electrical performance of multilayer MoS2 transistors on high-0k Al2O3 coated Si substrate. AIP Advances 5, 057102 (2015).*
(Continued)

*Primary Examiner* — Galina G Yushina
(74) *Attorney, Agent, or Firm* — ScienBiziP, P.C.

(57) ABSTRACT

The disclosure relates to a thin film transistor and a method for making the same. The thin film transistor includes a substrate; a semiconductor layer on the substrate, wherein the semiconductor layer includes nano-scaled semiconductor materials; a source and a drain, wherein the source and the drain are on the substrate, spaced apart from each other, and electrically connected to the semiconductor layer; a dielectric layer on the semiconductor layer, wherein the dielectric layer includes a first sub-dielectric layer and a second sub-dielectric layer stacked on one another, and the first sub-dielectric layer is a first oxide dielectric layer grown
(Continued)

by magnetron sputtering; and a gate in direct contact with the first sub-dielectric layer. The thin film transistor almost has no current hysteresis.

17 Claims, 21 Drawing Sheets

(51) Int. Cl.
    *H01L 51/00*     (2006.01)
    *H01L 29/16*     (2006.01)
    *H01L 29/06*     (2006.01)
    *H01L 29/24*     (2006.01)
    *C08L 67/02*     (2006.01)
    *H01L 29/66*     (2006.01)
    *H01L 51/05*     (2006.01)
    *H01L 29/786*     (2006.01)

(52) U.S. Cl.
    CPC ...... *H01L 29/0665* (2013.01); *H01L 29/1606* (2013.01); *H01L 29/24* (2013.01); *H01L 29/66742* (2013.01); *H01L 29/78603* (2013.01); *H01L 51/0048* (2013.01); *H01L 51/0525* (2013.01); *H01L 51/0529* (2013.01); *C08L 2203/16* (2013.01); *H01L 2029/42388* (2013.01); *H01L 2251/303* (2013.01)

(58) Field of Classification Search
    CPC ............. H01L 29/1606; H01L 51/0529; H01L 51/0048; H01L 21/02266; H01L 2251/303; H01L 2029/42388; C08L 67/02; C08L 2203/16

See application file for complete search history.

(56) References Cited

U.S. PATENT DOCUMENTS

| | | | |
|---|---|---|---|
| 2010/0295038 A1* | 11/2010 | Tada | H01L 29/7869 257/43 |
| 2011/0092017 A1 | 4/2011 | Akimoto et al. | |
| 2013/0306966 A1* | 11/2013 | Seon | H01L 29/66969 257/43 |
| 2014/0070190 A1* | 3/2014 | Chen | H01L 27/3225 257/40 |
| 2016/0190493 A1 | 6/2016 | Li et al. | |

FOREIGN PATENT DOCUMENTS

| | | |
|---|---|---|
| JP | 2009-283924 A | 12/2009 |
| JP | 2011-176168 A | 9/2011 |
| TW | 201246317 A | 11/2012 |
| TW | 201624729 A | 7/2016 |

OTHER PUBLICATIONS

Radisavljevic et al. Single-layer MoS2 transistors. Nature Nanotechnology Letters. 2011, pp. 147-150 (Year: 2011).*

* cited by examiner

THIN FILM TRANSISTOR AND METHOD FOR MAKING THE SAME

CROSS-REFERENCE TO RELATED APPLICATIONS

This application claims all benefits accruing under 35 U.S.C. § 119 from China Patent Application No. 201611114659.5, filed on Dec. 7, 2016, in the China Intellectual Property Office, the disclosure of which is incorporated herein by reference. This application is related to applications entitled, "THIN FILM TRANSISTOR AND METHOD FOR MAKING THE SAME", filed on Nov. 20, 2017 with a application Ser. No. 15/817,499, "THIN FILM TRANSISTOR AND METHOD FOR MAKING THE SAME", filed on Nov. 20, 2017 with a application Ser. No. 15/817,513, "THIN FILM TRANSISTOR AND METHOD FOR MAKING THE SAME", filed on Nov. 17, 2017 with a application Ser. No. 15/815,983, and "LOGIC CIRCUIT BASED ON THIN FILM TRANSISTOR", filed on Nov. 20, 2017 with a application Ser. No. 15/817,534, "LOGIC CIRCUIT BASED ON THIN FILM TRANSISTOR", filed on Nov. 20, 2017 with a application Ser. No. 15/817,540.

BACKGROUND

1. Technical Field

The present disclosure relates to thin film transistor (TFT), especially, relates to thin film transistor based on nano-scaled semiconductor materials.

2. Description of Related Art

Thin film transistors are widely utilized in flat plate display, such as liquid crystal display (LCD). Thin film transistor usually includes a substrate, a gate, a dielectric layer, a semiconductor layer, a source, and a drain.

Semiconducting single-walled carbon nanotubes (SW-CNTs) are promising candidate materials for use in future electronic devices because of their excellent electrical and mechanical properties, including high mobility, large current density, and extremely good mechanical strength. While thin film transistor using SWCNTs as conductive channels have been widely studied over the past few years, some obstacles have still to be overcome before these devices will be suitable for general use. One of most critical problems is the current hysteresis that is observed in the transfer characteristics of most SWCNT-TFTs, and also in devices based on other two-dimensional materials, such as $MoS_2$. Current hysteresis is highly undesirable in logic devices, sensors and driver circuits because it would cause a shift in the threshold voltage ($V_{th}$) when the voltage sweeping direction or range changes, particularly near the subthreshold state. There is consensus over several of the factors that cause current hysteresis, including trap states in the dielectric, on the dielectric surface or at interface between the semiconductor layer and the dielectric, fixed charges in the dielectric, and environmental adsorbates, including water molecules and dipoles. Therefore, fabrication methods for small-current hysteresis or current hysteresis-free TFTs have been proposed and realized by eliminating or neutralizing the above factors. However, there are still some other imperfections that have to be resolved.

What is needed, therefore, is a thin film transistor, a method for making the same, and a logic circuit using the same, that overcomes the problems as discussed above.

BRIEF DESCRIPTION OF THE DRAWINGS

Many aspects of the exemplary embodiments can be better understood with reference to the following drawings. The components in the drawings are not necessarily drawn to scale, the emphasis instead being placed upon clearly illustrating the principles of the exemplary embodiments. Moreover, in the drawings, like reference numerals designate corresponding parts throughout the several views.

DETAILED DESCRIPTION

Figure 1:
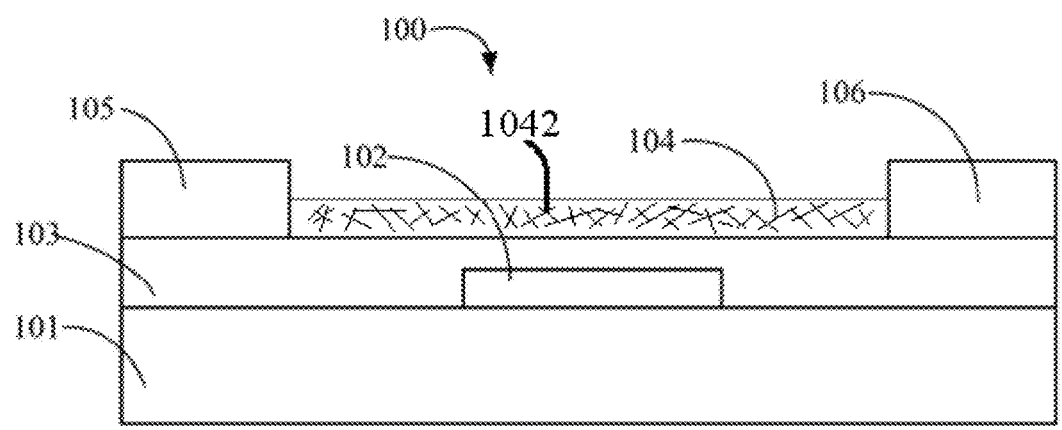
FIG. 1 is a cross-sectional view of example I of a thin film transistor.
Figure 2:
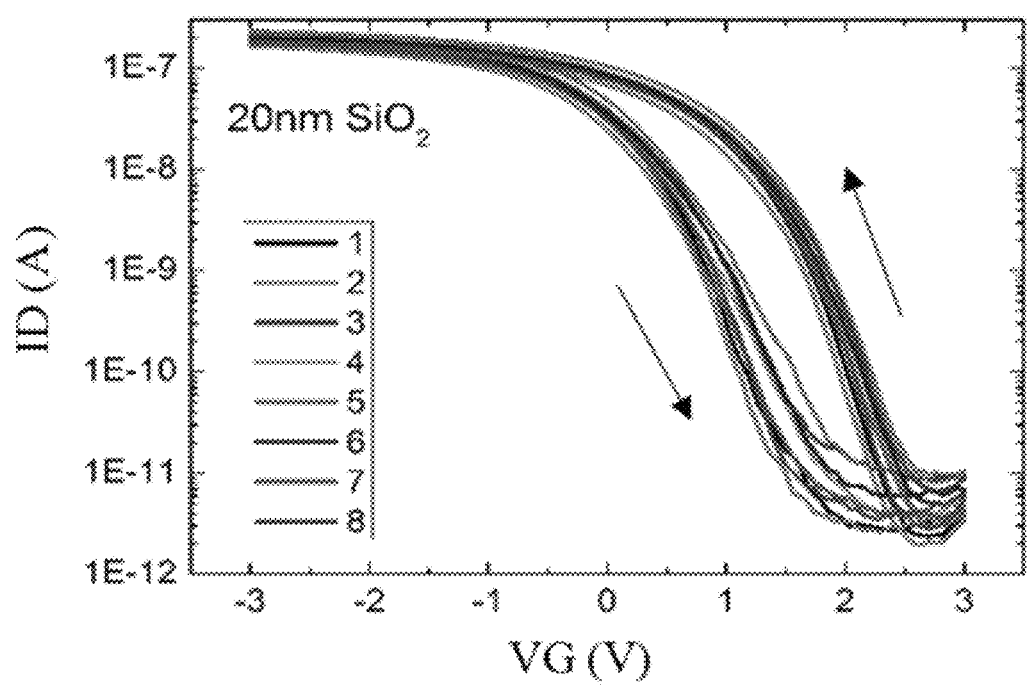
FIG. 2 is a diagram showing current hysteresis of a thin film transistor of comparative example 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to considered as limiting the scope of the exemplary embodiments described herein.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" exemplary embodiment in this disclosure are not necessarily to the same exemplary embodiment, and such references mean at least one.

The CNT-TFTs using conventional dielectric layers have a current hysteresis, which is defined as normal current hysteresis. The conventional dielectric layers can be $Al_2O_3$ layer, $SiO_2$ layer, $HfO_2$ layer, or $Si_3N_4$ layer, that are grown by methods other than magnetron sputtering, such as atomic layer deposition (ALD), electron beam evaporation, thermal oxidation and plasma-enhanced chemical vapour deposition (PECVD). It is found that use of oxide dielectric layers grown by magnetron sputtering can achieve inverse current hysteresis in CNT-TFTs as compared with that in CNT-TFTs using conventional dielectric layers above. The inverse current hysteresis is defined as abnormal current hysteresis. In this disclosure, the conventional dielectric layers is defined as normal dielectric layers and can produce normal current hysteresis, and the oxide dielectric layers grown by magnetron sputtering is defined as abnormal dielectric layers and can produce abnormal current hysteresis. By stacking one of these abnormal dielectric layers with more commonly-used normal dielectric layers, small-current hysteresis TFTs or even current hysteresis-free TFTs can be produced.

This method is compatible with back-gate, top-gate, p-type, n-type and ambipolar SWCNT-TFTs. The method is also suitable for use with other two-dimensional materials, such as $MoS_2$ TFTs. Because magnetron sputtering is a mature and stable technology, the fabrication process can easily be implemented on a large scale and is compatible with existing semiconductor industry processes, unlike other current hysteresis reduction methods. The output characteristics and the frequency responses of the large-current hysteresis and small-current hysteresis CNT-TFTs and logic circuit are compared. It is found that the performance of the small-current hysteresis TFTs in this disclosure is much better than that of the large-current hysteresis devices and is thus more suitable for practical applications.

References will now be made to the drawings to describe, in detail, various examples of the present thin film transistors, methods for making the same, and logic circuits using the same.

Example I

Referring to FIG. 1, in example I, a thin film transistor 100 is provided. The thin film transistor 100 is back-gate type and includes a substrate 101, a gate 102, a dielectric layer 103, a semiconductor layer 104, a source 105, and a drain 106. The gate 102 is located on a surface of the substrate 101. The dielectric layer 103 is located on the substrate 101 and covers the gate 102. The semiconductor layer 104 is located on a surface of the dielectric layer 103 and spaced apart from the gate 102. The source 105 and the drain 106 are located on the dielectric layer 103, spaced apart from each other, and electrically connected to the semiconductor layer 104. A channel is formed between the source 105 and the drain 106 by the semiconductor layer 104. The semiconductor layer 104 includes a first surface on one side of the semiconductor layer 104 and a second surface on opposite side of the semiconductor layer 104, the first surface is in direct contact with the dielectric layer 103, and the second surface is exposed to air and free of any other layer thereon.

The substrate 101 supports the gate 102, the dielectric layer 103, the semiconductor layer 104, the source 105, and the drain 106. A shape of the substrate 101 can be selected as needed. A material of the substrate 101 can be hard materials or flexible materials. The hard material can be glass, quartz, ceramics, diamond, or a combination thereof. The flexible material can be polymer such as polyethylene terephthalate, polyethylene naphthalate, polyethylene terephthalate, polyimide (PI), or a combination thereof. In present exemplary embodiment, the substrate 101 is a silicon wafer with a silicon dioxide layer thereon.

The dielectric layer 103 is an oxide dielectric layer grown by magnetron sputtering and in physical direct contact with the gate 102. The thickness of the dielectric layer 103 is in a range of about 10 nanometers to about 1000 nanometers. The oxide dielectric layer can be a metal oxide dielectric layer, such as an $Al_2O_3$ layer. The oxide dielectric layer can also be a silicon oxide dielectric layer, such as a $SiO_2$ layer. In present exemplary embodiment, the dielectric layer 103 is a $SiO_2$ layer with a thickness of about 20 nanometers.

The semiconductor layer 104 includes a plurality of nano-scaled semiconductor materials 1042. The nano-scaled semiconductor materials 1042 can be graphene, carbon nanotubes, $MoS_2$, $WS_2$, $MnO_2$, $ZnO$, $MoSe_2$, $MoTe_2$, $TaSe_2$, $NiTe$, $Bi_2Te_3$, or a combination thereof. The nano-scaled semiconductor materials 1042 can be grown, transferred, deposited or spin coated on the dielectric layer 103. When the nano-scaled semiconductor materials 1042 are nano-scaled semiconductor sheets, the semiconductor layer 104 can includes a single nano-scaled semiconductor sheet or a plurality of nano-scaled semiconductor sheets stacked on one another, and a total number of the plurality of nano-scaled semiconductor sheets is about 2 to 5. In present exemplary embodiment, the semiconductor layer 104 includes a plurality of semiconducting single-walled carbon nanotubes intersected with each other to form a mesh.

The gate 102, the source 105, and the drain 106 can be conductive films with a thickness in a range of about 0.5 nanometers to about 100 micrometers. The gate 102, the source 105, and the drain 106 can be made by a method such as chemical vapor deposition, electron beam evaporation, thermal deposition, or magnetron sputtering. The material of the gate 102, the source 105, and the drain 106 can be metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal. In present exemplary embodiment, the each of the gate 102, the source 105, and the drain 106 is a Ti/Au alloy film with a thickness of about 40 nanometers.

The thin film transistor 100 is made by following steps:

Step S11, providing a substrate 101;

Step S12, depositing a gate 102 on a surface of the substrate 101;

Step S13, forming an oxide dielectric layer 103 by magnetron sputtering, where the oxide dielectric layer 103 covers the gate 102 and is in direct contact with the gate 102;

Step S14, applying a semiconductor layer 104 on a surface of the dielectric layer 103, where the semiconductor layer 104 includes a plurality of nano-scaled semiconductor materials; and Step S15, forming a source 105 and a drain 106 on the dielectric layer 103, where the source 105 and the drain 106 are spaced apart from each other and are electrically connected to the semiconductor layer 104.

In step 11, the substrate 101 is a silicon wafer with a silicon dioxide layer thereon. In step 12 and step 15, each of the gate 102, the source 105, and the drain 106 is a Ti/Au alloy film with a thickness of about 40 nanometers. In step 13, a $SiO_2$ layer is grown on the substrate 101 by magnetron sputtering to form the dielectric layer 103 to cover the gate 102. The vacuum of the magnetron sputtering device before the magnetron sputtering is less than $10^{-5}$ Pa. During magnetron sputtering, the distance between the sputtering target and the substrate 101 is in a range of about 50 millimeters to about 120 millimeters, the sputtering power is in a range of about 150 W to about 200 W. Morever, the carrier gas is argon gas, and the pressure is in a range of about 0.2 Pa to about 1 Pa. In step 14, a plurality of semiconducting single-walled carbon nanotubes are deposited on the dielectric layer 103 to form the semiconductor layer 104.

In present exemplary embodiment, five samples of the thin film transistors 100 are made. The five samples have similar structure except that the thicknesses of the $SiO_2$ dielectric layers 103 are respectively 10 nanometers, 20 nanometers, 100 nanometers, 500 nanometers, and 1000 nanometers.

Furthermore, four comparative examples are made. The thin film transistors of comparative examples 1-4 and example I have similar structure except that the dielectric layers 103 of the four comparative examples are normal dielectric layers. In comparative example 1, the dielectric layer 103 is a $SiO_2$ layer with a thickness of 20 nanometers and formed by electron beam evaporation. In comparative example 2, the dielectric layer 103 is an $Al_2O_3$ layer with a thickness of 20 nanometers and formed by electron beam evaporation. In comparative example 3, the dielectric layer 103 is an $Al_2O_3$ layer with a thickness of 20 nanometers and formed by atomic layer deposition. In comparative example 4, the dielectric layer 103 is a $HfO_2$ layer with a thickness of 20 nanometers and formed by atomic layer deposition. In comparative examples 1-4, many samples are made. The current hysteresis of the four comparative examples and one sample of example I are tested in air and shown in FIGS. 2-6 and table 1 below. During testing the current hysteresis, the semiconductor layer 104 is exposed to air.

TABLE 1

Comparison between example I and comparative example(s)

| | dielectric layer | | current | |
|---|---|---|---|---|
| | material | method | hysteresis | polarity |
| comparative example 1 | $SiO_2$ | electron beam evaporation | anticlockwise | p-type |
| comparative example 2 | $Al_2O_3$ | electron beam evaporation | anticlockwise | p-type |
| comparative example 3 | $Al_2O_3$ | ALD | anticlockwise | p-type |
| comparative example 4 | $HfO_2$ | ALD | anticlockwise | p-type |
| example I | $SiO_2$ | magnetron sputtering | clockwise | p-type |

Figure 6:
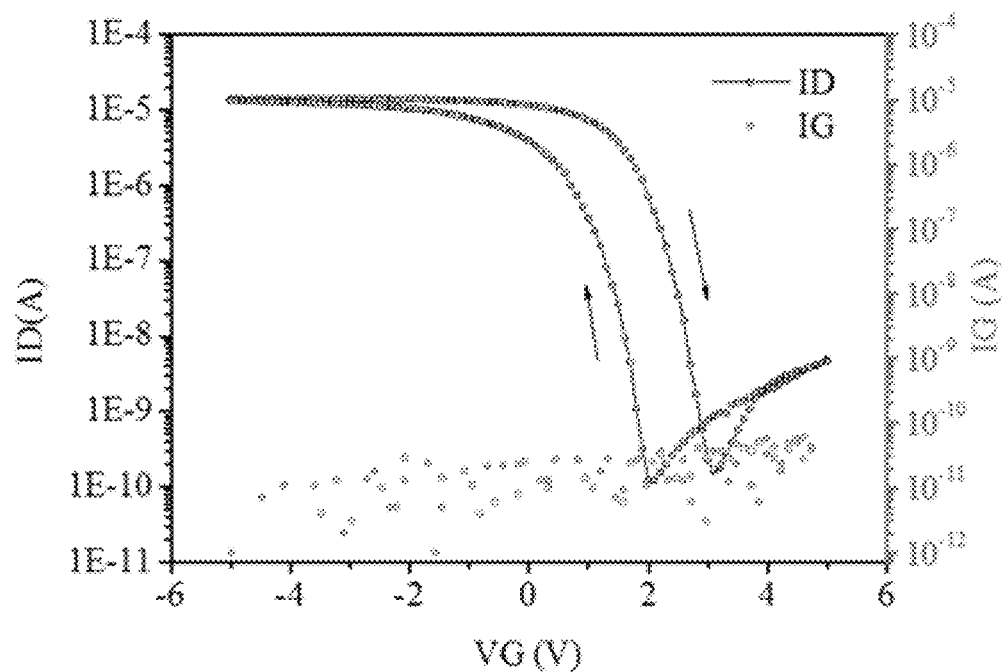
FIG. 6 is a diagram showing current hysteresis of the thin film transistor in example I.

As shown in table 1 above, all thin film transistors of the four comparative examples and example I are p-type. As shown in FIGS. 2-5, all thin film transistors of the four comparative examples have anticlockwise current hysteresis which is defined as normal current hysteresis of p-type thin film transistor. As shown in FIG. 6, the thin film transistor in example I has clockwise current hysteresis which is defined as abnormal current hysteresis or inverse current hysteresis of p-type thin film transistor. From table 1, it is found that the back-gate thin film transistor with abnormal current hysteresis can be achieved by using the $SiO_2$ layer, that is grown by magnetron sputtering, as the dielectric layers 103.

Example II

Figure 7:
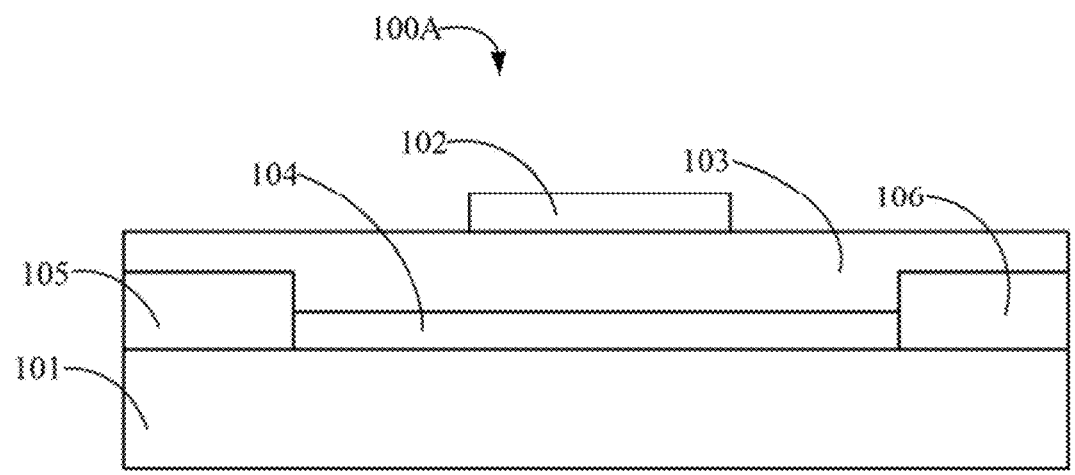
FIG. 7 is a cross-sectional view of example II of a thin film transistor.

Referring to FIG. 7, in example II, a thin film transistor 100A is provided. The thin film transistor 100A is top-gate type and includes a substrate 101, a gate 102, a dielectric layer 103, a semiconductor layer 104, a source 105, and a drain 106. The semiconductor layer 104 is located on a surface of the substrate 101. The source 105 and the drain 106 are located on the substrate 101, spaced apart from each other, and electrically connected to the semiconductor layer 104. A channel is formed between the source 105 and the drain 106 by the semiconductor layer 104. The dielectric layer 103 is located on a surface of the semiconductor layer 104 and covers the semiconductor layer 104, the source 105, and the drain 106. The gate 102 is located on a surface of the dielectric layer 103 and spaced apart from the semiconductor layer 104.

The thin film transistor 100A in example II is similar to the thin film transistor 100 in example I except that the thin film transistor 100A is top-gate type, but the thin film transistor 100 is back-gate.

The thin film transistor 100 is made by following steps:

Step S21, providing a substrate 101;

Step S22, applying a semiconductor layer 104 on a surface of the substrate 101, where the semiconductor layer 104 includes a plurality of nano-scaled semiconductor materials;

Step S23, forming a source 105 and a drain 106 on the substrate 101, where the source 105 and the drain 106 are spaced apart from each other and are electrically connected to the semiconductor layer 104;

Step S24, forming an oxide dielectric layer 103 by magnetron sputtering, where the oxide dielectric layer covers the semiconductor layer 104, the source 105, and the drain 106; and Step S25, depositing a gate 102 on a surface of the dielectric layer 103, where the gate 102 is in direct contact with the dielectric layer 103.

In present exemplary embodiment, one sample of the thin film transistors 100A is made. The dielectric layers 103 is a $SiO_2$ layer with a thickness of 20 nanometers and grown by magnetron sputtering.

Furthermore, two comparative examples are made. The thin film transistors of comparative examples 5-6 and example II have similar structure except that the dielectric layers 103 of the two comparative examples are normal dielectric layers. In comparative example 5, the dielectric layer 103 is a $SiO_2$ layer with a thickness of 20 nanometers and formed by electron beam evaporation. In comparative example 6, the dielectric layer 103 is a $Y_2O_3$ layer with a thickness of 20 nanometers and formed by thermal oxidation. The current hysteresis of the two comparative examples and the example II are tested and shown in FIGS. 8-10 and table 2 below.

TABLE 2

Comparison between example II and comparative example(s)

| | dielectric layer | | current | |
|---|---|---|---|---|
| | material | method | hysteresis | polarity |
| comparative example 5 | $SiO_2$ | electron beam evaporation | anticlockwise | p-type |
| comparative example 6 | $Y_2O_3$ | thermal oxidation | anticlockwise | p-type |
| example II | $SiO_2$ | magnetron sputtering | clockwise | p-type |

Figure 8:
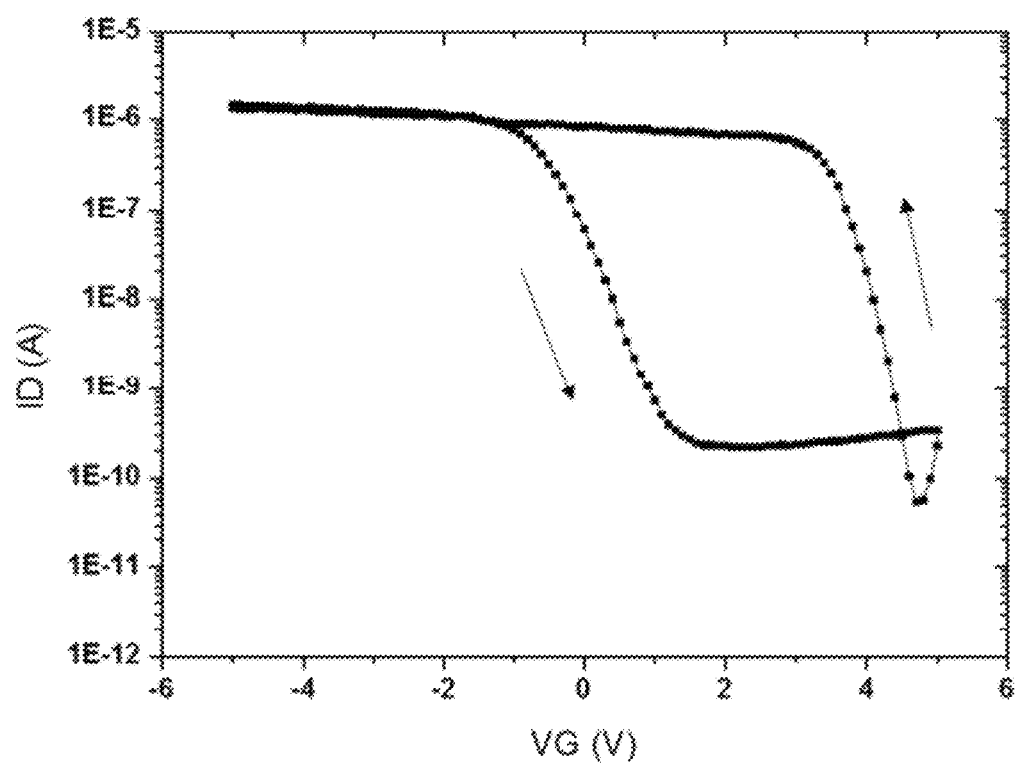
FIG. 8 is a diagram showing current hysteresis of a thin film transistor of comparative example 5.
Figure 9:
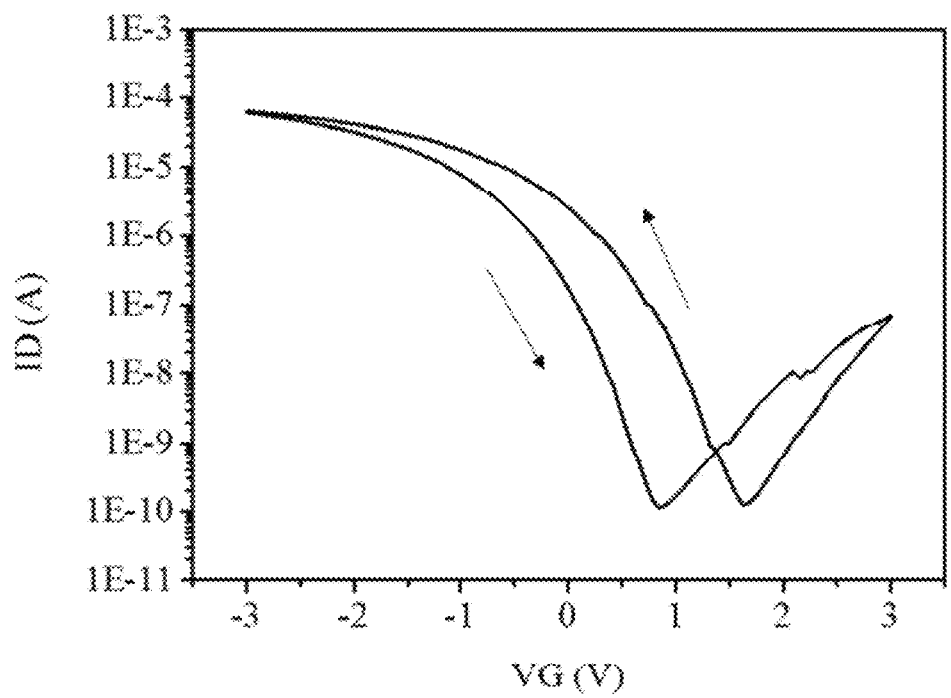
FIG. 9 is a diagram showing current hysteresis of a thin film transistor of comparative example 6.
Figure 10:
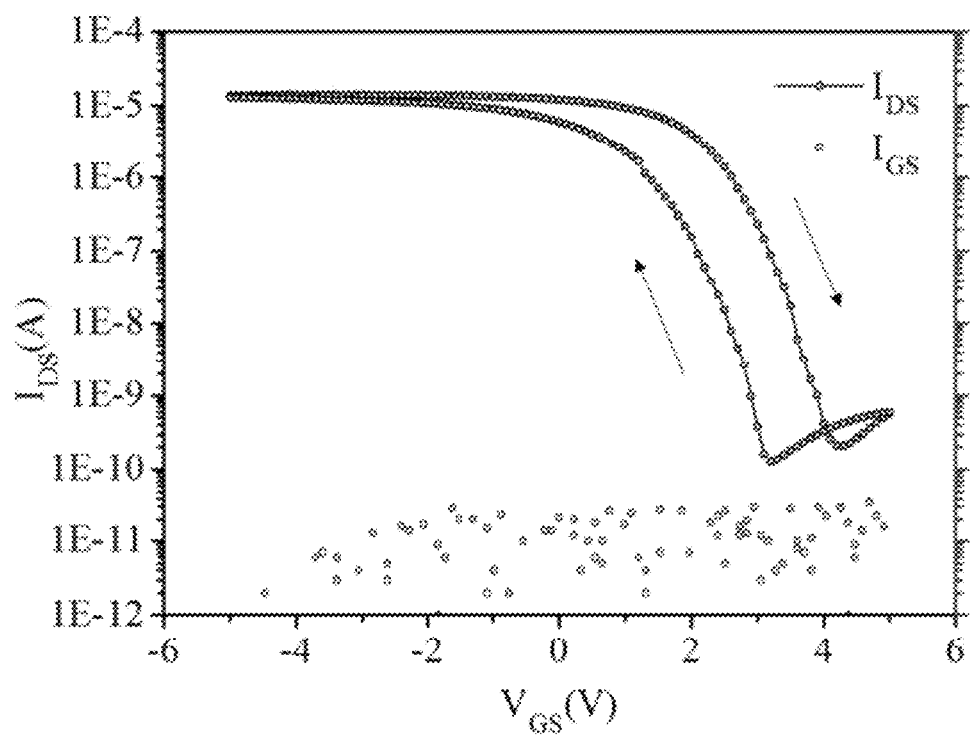
FIG. 10 is a diagram showing current hysteresis of the thin film transistor in example II.

As shown in table 2 above, all thin film transistors of the two comparative examples and example II are p-type. As shown in FIGS. 8-9, all thin film transistors of the two comparative examples have anticlockwise current hysteresis. As shown in FIG. 10, the thin film transistor in example II has clockwise current hysteresis. From table 2, it is found that the top-gate thin film transistor with abnormal current hysteresis can be achieved by using the $SiO_2$ layer that is grown by magnetron sputtering, as the dielectric layers 103.

Example III

Figure 11:
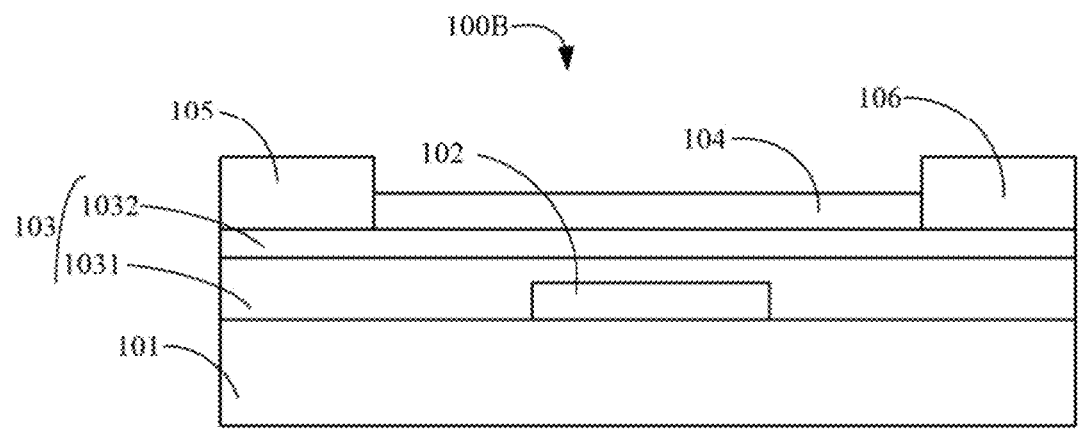
FIG. 11 is a cross-sectional view of example III of a thin film transistor.

Referring to FIG. 11, in example III, a thin film transistor 100B is provided. The thin film transistor 100B is back-gate type and includes a substrate 101, a gate 102, a dielectric layer 103, a semiconductor layer 104, a source 105, and a drain 106. The gate 102 is located on a surface of the substrate 101. The dielectric layer 103 is located on the substrate 101 and covers the gate 102. The semiconductor layer 104 is located on a surface of the dielectric layer 103. The source 105 and the drain 106 are located on the dielectric layer 103, spaced apart from each other, and electrically connected to the semiconductor layer 104. A channel is formed between the source 105 and the drain 106 by the semiconductor layer 104.

The thin film transistor 100B in example III is similar to the thin film transistor 100 in example I except that the dielectric layer 103 is a double-layer structure and includes a first sub-dielectric layer 1031 and a second sub-dielectric layer 1032 stacked on one another. In present exemplary embodiment, the dielectric layer 103 consists of the first sub-dielectric layer 1031 and the second sub-dielectric layer 1032. The first sub-dielectric layer 1031 is an abnormal dielectric layer, and the second sub-dielectric layer 1032 is a normal dielectric layer.

The thin film transistor 100B is made by following steps:

Step S31, providing a substrate 101;

Step S32, depositing a gate 102 on a surface of the substrate 101;

Step S33, forming an oxide first sub-dielectric layer 1031 by magnetron sputtering, where the oxide dielectric layer covers and in direct contact with the gate 102;

Step S34, forming a second sub-dielectric layer 1032 on a surface of the first sub-dielectric layer 1031;

Step S35, applying a semiconductor layer 104 on a surface of the second sub-dielectric layer 1032, where the semiconductor layer 104 includes a plurality of nano-scaled semiconductor materials; and Step S36, forming a source 105 and a drain 106 on the second sub-dielectric layer 1032, where the source 105 and the drain 106 are spaced apart from each other and are electrically connected to the semiconductor layer 104.

In present exemplary embodiment, one sample of the thin film transistors 100B is made. The first sub-dielectric layer

1031 is a SiO$_2$ layer with a thickness of 20 nanometers and grown by magnetron sputtering. The second sub-dielectric layer 1032 is an Al$_2$O$_3$ layer with a thickness of 20 nanometers and grown by ALD.

Furthermore, one comparative example 7 of the thin film transistors 100B are made. The thin film transistors of comparative example 7 and example III have similar structure except that, in comparative example 7, the first sub-dielectric layer 1031 is an Al$_2$O$_3$ layer with a thickness of 20 nanometers and grown by ALD, and the second sub-dielectric layer 1032 is a SiO$_2$ layer with a thickness of 20 nanometers and grown by magnetron sputtering. The current hysteresis of comparative example 7 and example III are tested and shown in FIGS. 12-13 and table 3 below.

TABLE 3

Comparison between example III and comparative example(s)

| | dielectric layer | | | |
| --- | --- | --- | --- | --- |
| | first sub-dielectric layer | second sub-dielectric layer | current hysteresis | polarity |
| comparative example 7 | Al$_2$O$_3$ by ALD | SiO$_2$ by magnetron sputtering | not reduced | p-type |
| example III | SiO$_2$ by magnetron sputtering | Al$_2$O$_3$ by ALD | obviously reduced, even free | p-type |

Figure 4:
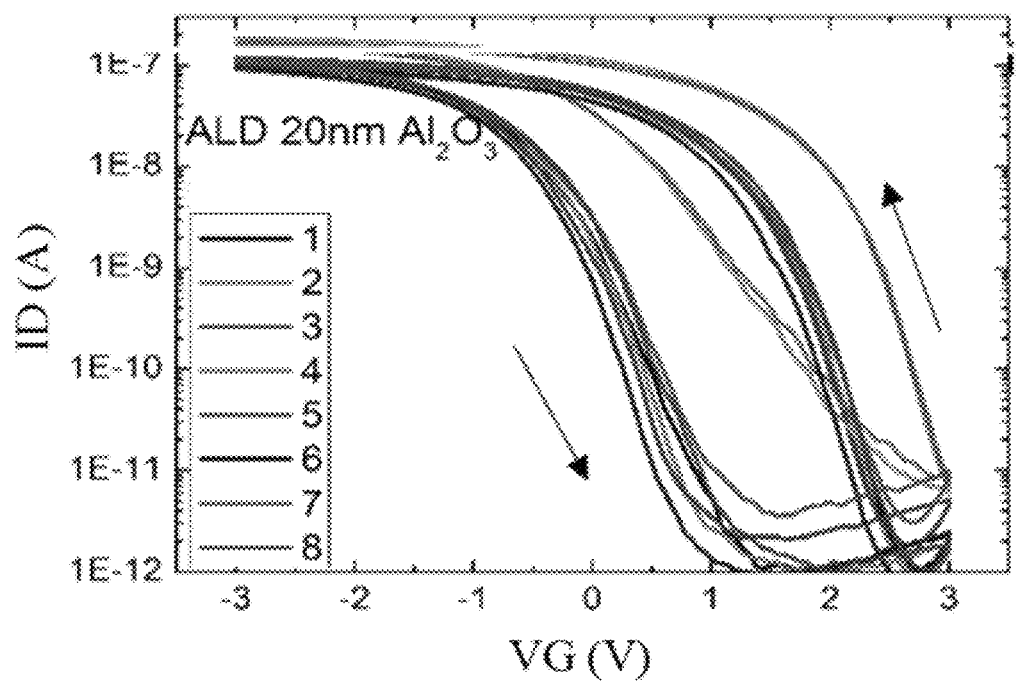
FIG. 4 is a diagram showing current hysteresis of a thin film transistor of comparative example 3.
Figure 5:
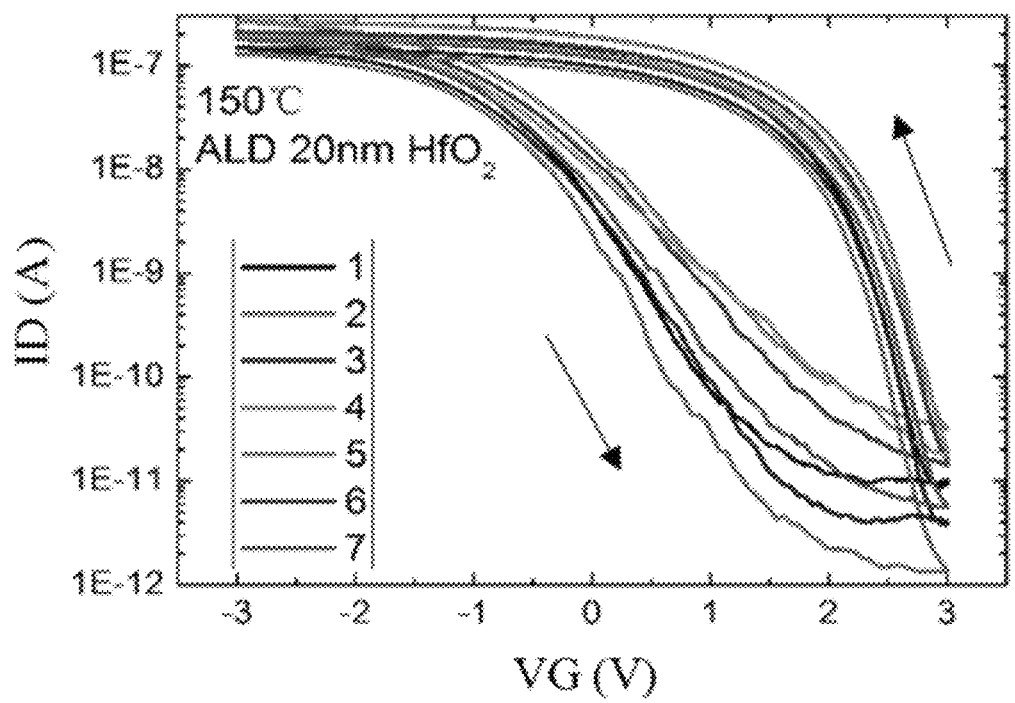
FIG. 5 is a diagram showing current hysteresis of a thin film transistor of comparative example 4.
Figure 12:
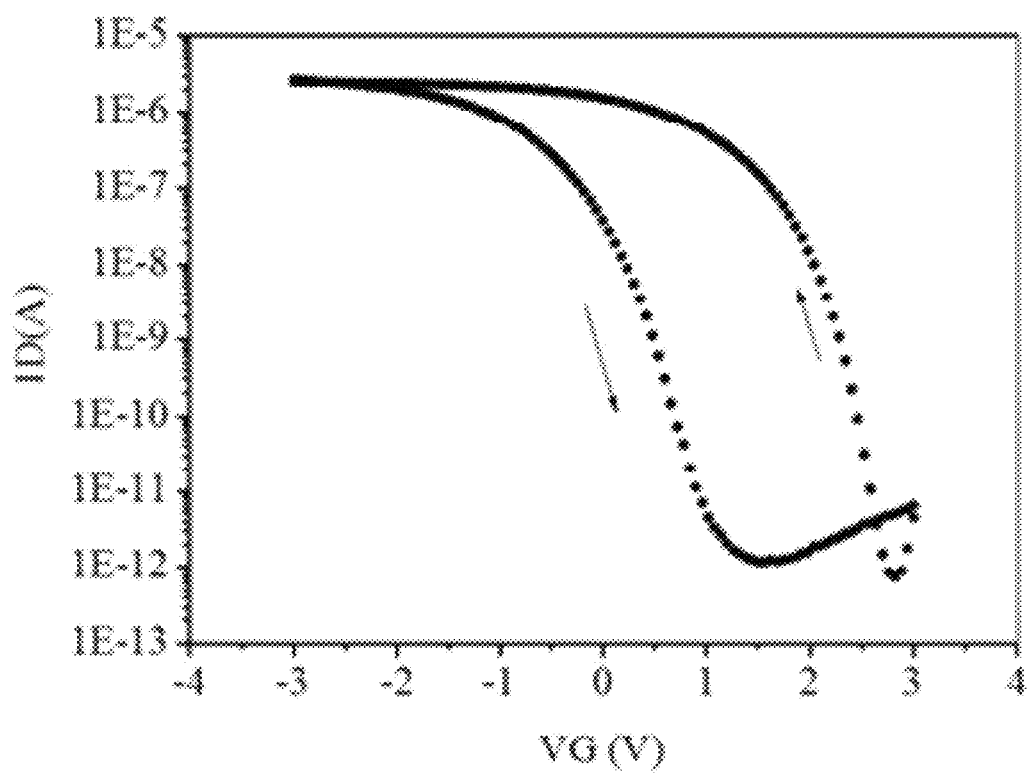
FIG. 12 is a diagram showing current hysteresis of a thin film transistor of comparative example 7.
Figure 13:
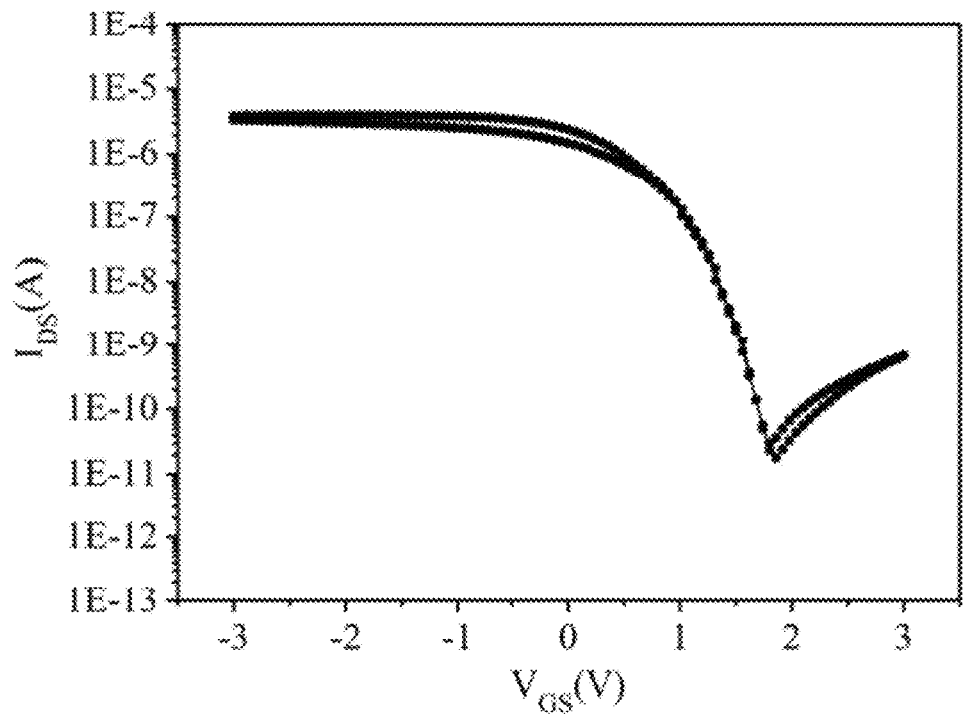
FIG. 13 is a diagram showing current hysteresis of the thin film transistor in example III.

As shown in table 3 above, both the thin film transistors of comparative example 7 and example III are p-type. As shown in FIGS. 12 and 4, thin film transistors of comparative example 7 and comparative example 3 have similar normal current hysteresis. It is found that the when the abnormal dielectric layer of comparative example 7 has little influence on the normal current hysteresis. As shown in FIG. 13, the current hysteresis of the thin film transistor in example III is reduced and even free. Thus, it is found that the when the abnormal dielectric layer is located on a normal dielectric layer and spaced apart from the gate 102, the abnormal dielectric layer has little influence on the normal current hysteresis; when the abnormal dielectric layer is in direct contact with the gate 102, the abnormal dielectric layer can reduce the current hysteresis. When the abnormal dielectric layer is in direct contact with the gate 102, the abnormal dielectric layer can produce an abnormal current hysteresis to neutralize the normal current hysteresis produced by the normal dielectric layer. Thus, the current hysteresis of the thin film transistor in example III is eliminated.

Figure 14:
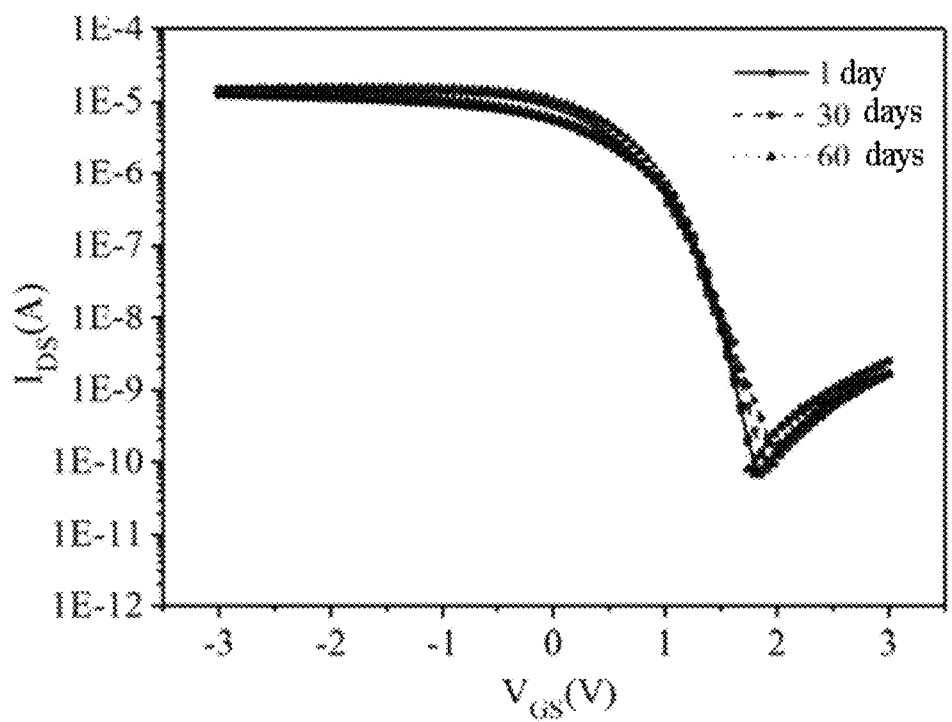
FIG. 14 is a diagram showing testing results of current hysteresis elimination stability of the thin film transistor in example III.

Furthermore, the current hysteresis elimination stability of the thin film transistor in example III is tested and shown in FIG. 14. FIG. 14 shows that the thin film transistor in example III has a consistent current hysteresis within 60 days. Thus, the structure in example III can eliminate current hysteresis of the thin film transistor 100B stably.

Example IV

The thin film transistor 100B in example IV is similar to the thin film transistor 100B in example III except that the first sub-dielectric layer 1031 is a SiO$_2$ layer with a thickness of 20 nanometers and grown by magnetron sputtering, and the second sub-dielectric layer 1032 is a SiO$_2$ layer with a thickness of 20 nanometers and grown by electron beam evaporation.

Furthermore, one comparative example 8 of the thin film transistors 100B are made. The thin film transistors of comparative example 8 and example IV have similar structure except that, in comparative example 8, the first sub-dielectric layer 1031 is a SiO$_2$ layer with a thickness of 20 nanometers and grown by electron beam evaporation, and the second sub-dielectric layer 1032 is a SiO$_2$ layer with a thickness of 20 nanometers and grown by magnetron sputtering. The current hysteresis of comparative example 8 and example IV are tested and shown in FIGS. 15-16 and table 4 below.

TABLE 4

Comparison between example IV and comparative example(s)

| | dielectric layer | | | |
| --- | --- | --- | --- | --- |
| | first sub-dielectric layer | second sub-dielectric layer | current hysteresis | polarity |
| comparative example 8 | SiO$_2$ by electron beam evaporation | SiO$_2$ by magnetron sputtering | not reduced | p-type |
| example IV | SiO$_2$ by magnetron sputtering | SiO$_2$ by electron beam evaporation | obviously reduced, even free | p-type |

Figure 15:
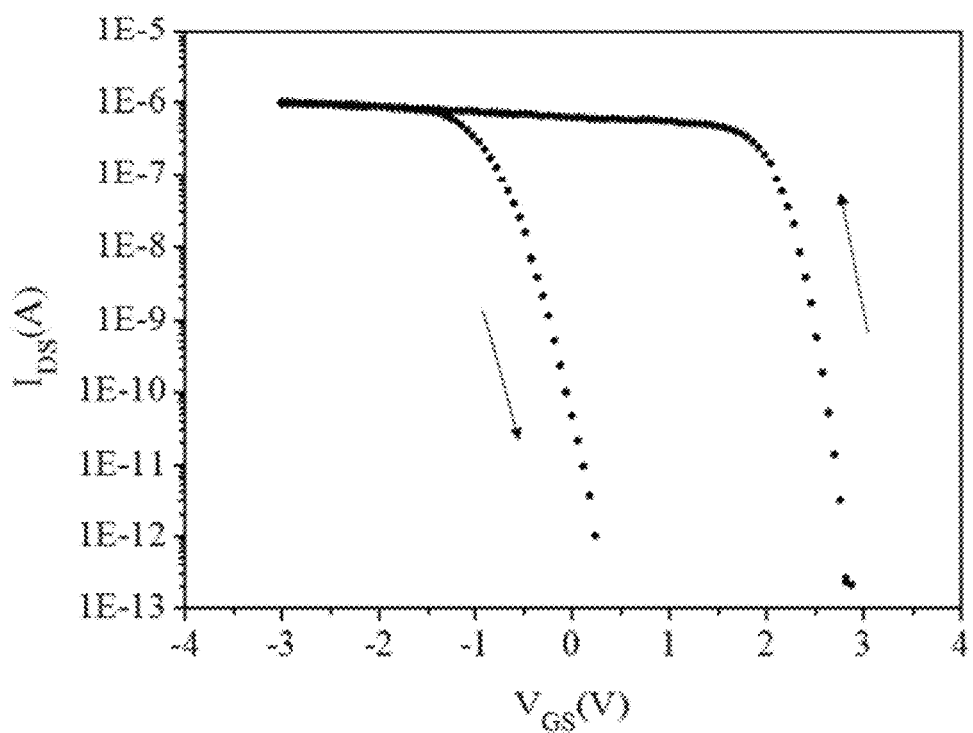
FIG. 15 is a diagram showing current hysteresis of a thin film transistor of comparative example 8.
Figure 16:
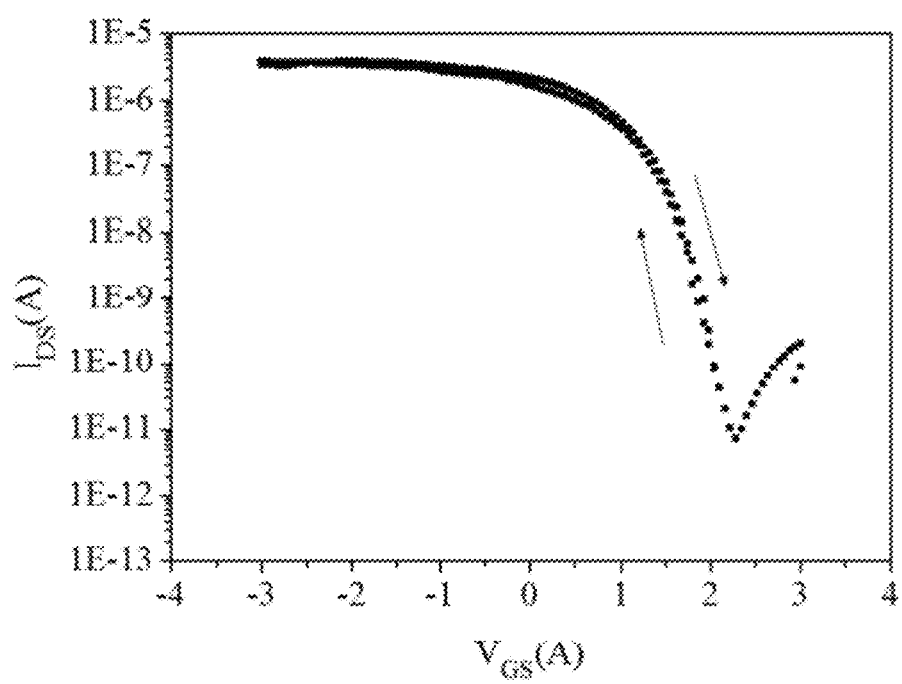
FIG. 16 is a diagram showing current hysteresis of the thin film transistor of example IV.

As shown in table 4 above, both the thin film transistors of comparative example 8 and example IV are p-type. As shown in FIG. 15, thin film transistor of comparative example 8 has obvious large normal current hysteresis. As shown in FIG. 16, the current hysteresis of the thin film transistor in example IV is reduced and even free. From comparative example 1 and comparative example 8, it is found that the SiO$_2$ layer grown by electron beam evaporation is a normal dielectric layer, and the SiO$_2$ layer grown by magnetron sputtering is an abnormal dielectric layer. It is found that only when the SiO$_2$ layer grown by magnetron sputtering is in direct contact with the gate 102, the SiO$_2$ layer grown by magnetron sputtering can produce an abnormal current hysteresis to neutralize the normal current hysteresis produced by the SiO$_2$ layer grown by electron beam. Thus, the current hysteresis of the thin film transistor in example IV is eliminated.

Example V

Figure 17:
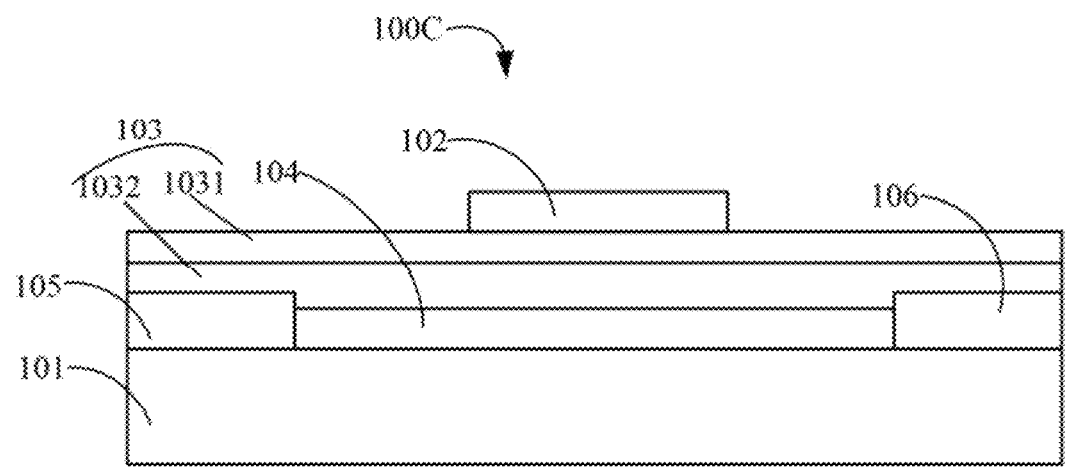
FIG. 17 is a cross-sectional view of example V of a thin film transistor.

Referring to FIG. 17, in example V, a thin film transistor 100C is provided. The thin film transistor 100C is top-gate type and includes a substrate 101, a gate 102, a dielectric layer 103, a semiconductor layer 104, a source 105, and a drain 106. The semiconductor layer 104 is located on a surface of the substrate 101. The source 105 and the drain 106 are located on the substrate 101, spaced apart from each other, and electrically connected to the semiconductor layer 104. A channel is formed between the source 105 and the drain 106 by the semiconductor layer 104. The dielectric layer 103 is located on the substrate 101 and covers the semiconductor layer 104, the source 105, and the drain 106. The gate 102 is located on a surface of the dielectric layer 103.

The thin film transistor 100C in example V is similar to the thin film transistor 100A in example II except that the dielectric layer 103 is a double-layer structure and includes a first sub-dielectric layer 1031 and a second sub-dielectric layer 1032 stacked on one another. In present exemplary embodiment, the dielectric layer 103 consists of the first sub-dielectric layer 1031 and the second sub-dielectric layer 1032. The first sub-dielectric layer 1031 is an abnormal dielectric layer, and the second sub-dielectric layer 1032 is a normal dielectric layer.

The thin film transistor 100C is made by following steps:

Step S51, providing a substrate 101;

Step S52, applying a semiconductor layer 104 on a surface of the substrate 101, where the semiconductor layer 104 includes a plurality of nano-scaled semiconductor materials;

Step S53, forming a source 105 and a drain 106 on the substrate 101, where the source 105 and the drain 106 are spaced apart from each other and are electrically connected to the semiconductor layer 104;

Step S54, forming a second sub-dielectric layer 1032 on the substrate 101, where the second sub-dielectric layer 1032 covers all of the semiconductor layer 104, the source 105, and the drain 106;

Step S55, forming an oxide first sub-dielectric layer 1031 on a surface of the second sub-dielectric layer 1032 by magnetron sputtering; and Step S56, depositing a gate 102 on a surface of the first sub-dielectric layer 1031, where the gate 102 is in direct contact with the first sub-dielectric layer 1031.

In present exemplary embodiment, one sample of the thin film transistors 100B is made. The first sub-dielectric layer 1031 is a SiO$_2$ layer with a thickness of 20 nanometers and grown by magnetron sputtering. The second sub-dielectric layer 1032 is an Y$_2$O$_3$ layer with a thickness of 5 nanometers and grown by thermal oxidation.

Furthermore, one comparative example 9 of the thin film transistors 100C are made. The thin film transistors of comparative example 9 and example V have similar structure except that, in comparative example 9, the first sub-dielectric layer 1031 is an Y$_2$O$_3$ layer with a thickness of 5 nanometers and grown by thermal oxidation, and the second sub-dielectric layer 1032 is a SiO$_2$ layer with a thickness of 20 nanometers and grown by magnetron sputtering. The current hysteresis of comparative example 9 and example V are tested and shown in FIGS. 18-19 and table 5 below.

TABLE 5

Comparison between example V and comparative example(s)

| | dielectric layer | | | |
|---|---|---|---|---|
| | first sub-dielectric layer | second sub-dielectric layer | current hysteresis | polarity |
| comparative | Y$_2$O$_3$ by thermal oxidation | SiO$_2$ by sputtering | not reduced | p-type |
| example V | SiO$_2$ by magnetron sputtering | Y$_2$O$_3$ by thermal oxidation | obviously reduced, even free | p-type |

Figure 18:
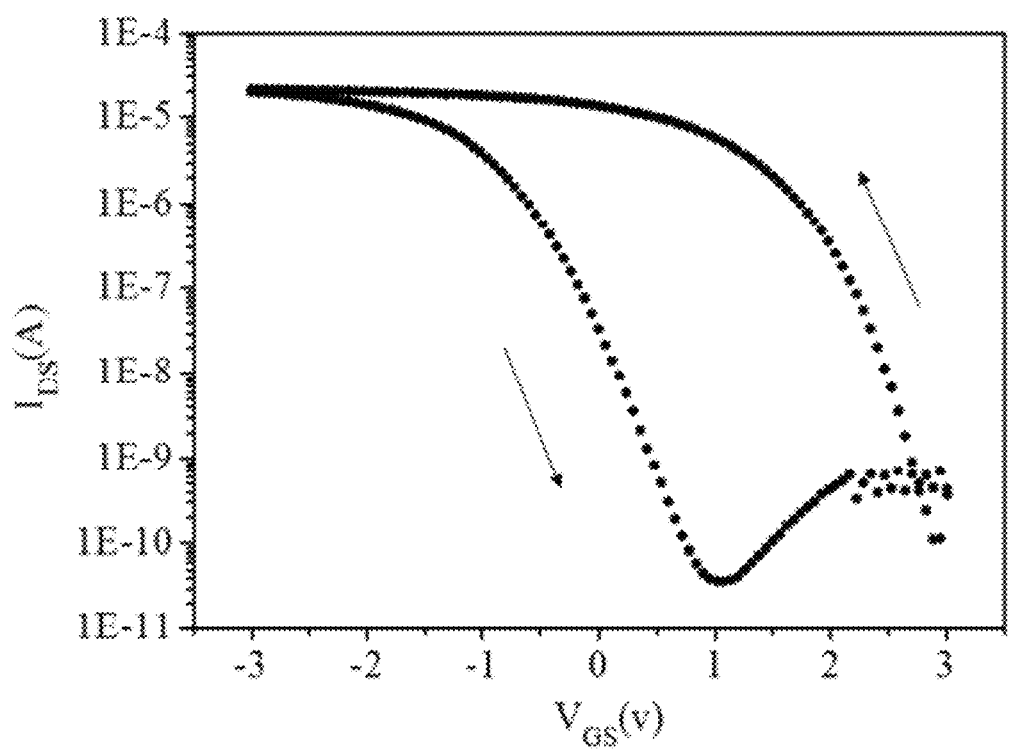
FIG. 18 is a diagram showing current hysteresis of a thin film transistor of comparative example 9.
Figure 19:
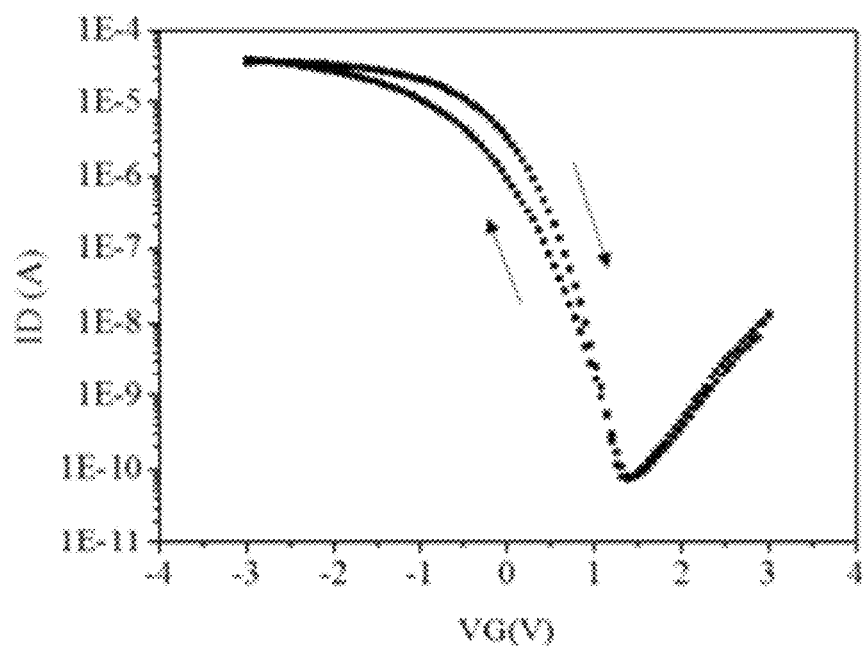
FIG. 19 is a diagram showing current hysteresis of the thin film transistor in example V.

As shown in table 5 above, both the thin film transistors of comparative example 9 and example V are p-type. As shown in FIG. 18, thin film transistor of comparative example 9 has obvious large normal current hysteresis. As shown in FIG. 19, the current hysteresis of the thin film transistor in example V is reduced and even free. It is also found that only when the SiO$_2$ layer grown by magnetron sputtering is in direct contact with the gate 102, the SiO$_2$ layer grown by magnetron sputtering can produce an abnormal current hysteresis to neutralize the normal current hysteresis produced by the Y$_2$O$_3$ layer grown through thermal oxidation. Thus, the current hysteresis of the thin film transistor in example V is eliminated.

Figure 20:
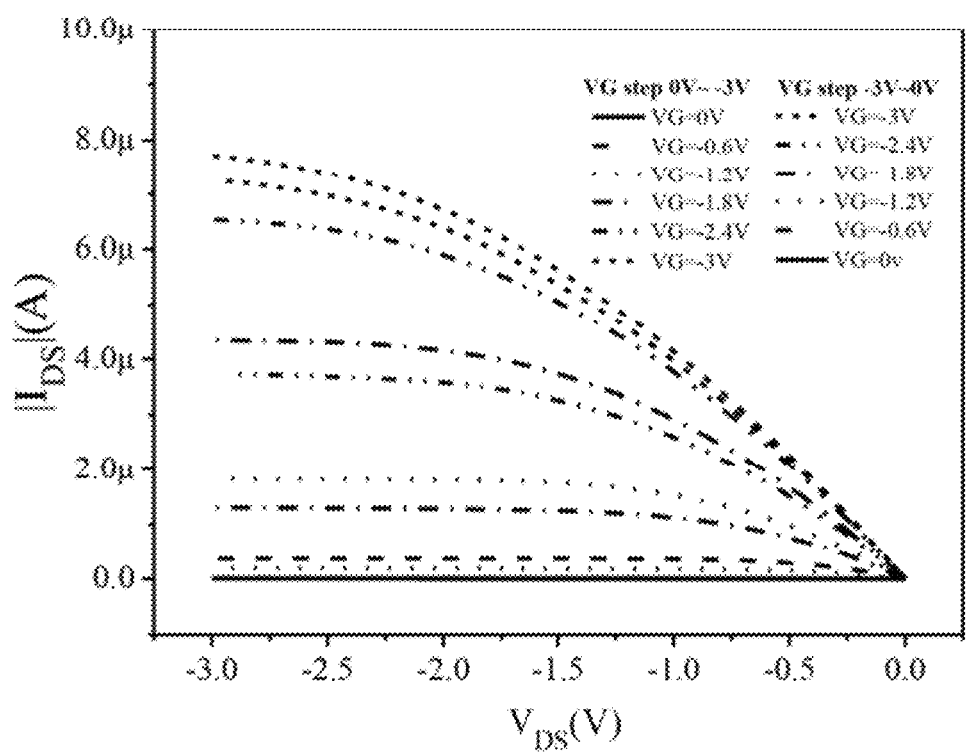
FIG. 20 is a diagram showing testing results of output characteristics of the thin film transistor of comparative example 9.
Figure 21:
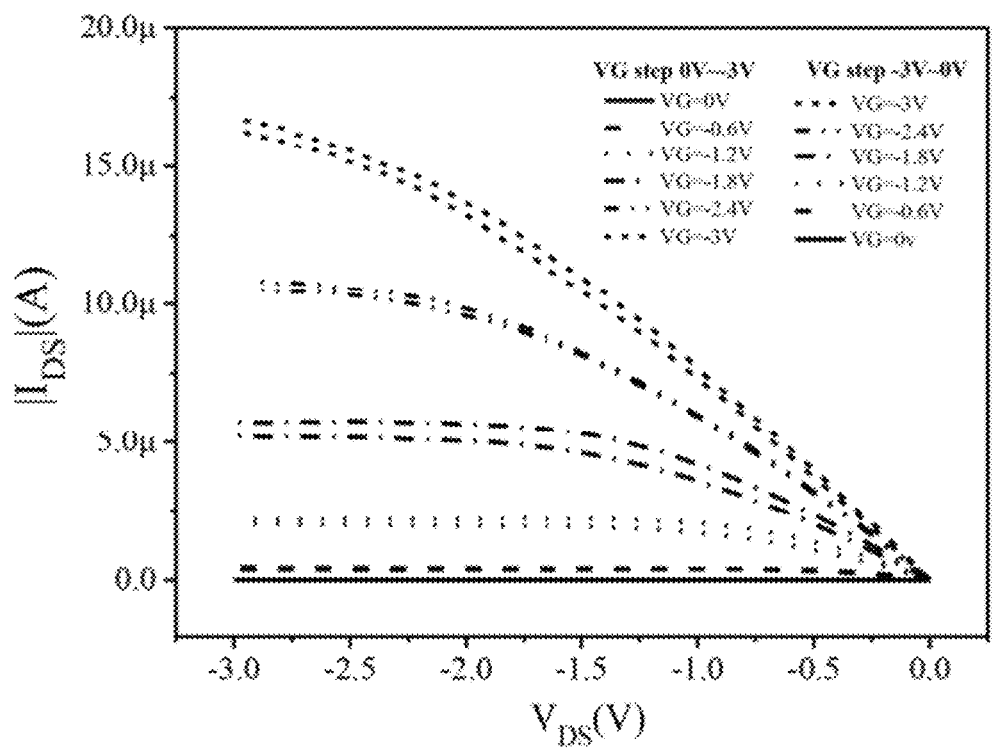
FIG. 21 is a diagram showing testing results of output characteristic of the thin film transistor in example V.

Furthermore, the output characteristics of the thin film transistors of comparative example 9 and the example V are tested. FIG. 20 shows the output characteristics of the thin film transistor of comparative example 9. FIG. 21 shows the output characteristic of the thin film transistor in example V. The $I_{DS}$-$V_{DS}$ curves is measured over the $V_{GS}$ in a range from 0 V to −3 V, with steps of −0.6 V, or and then in a range from −3V to 0 V, with steps of +0.6 V. It is found that because of the existence of the current hysteresis in comparative example 9, the output characteristics of the thin film transistor of comparative example 9 are misaligned when the direction of the gate voltage changes, as shown in FIG. 20. This misalignment would then influence the design of the logic device or the driver circuits when these output curves are used in the quiescent operating point model. However, the output curves of the thin film transistor in example V coincide neatly under different directions, as shown in FIG. 21, because of the elimination of the current hysteresis in example V.

Example VI

The thin film transistor 100C in example VI is similar to the thin film transistor 100C in example V except that the first sub-dielectric layer 1031 is a SiO$_2$ layer with a thickness of 20 nanometers and grown by magnetron sputtering, and the second sub-dielectric layer 1032 is an Al$_2$O$_3$ layer with a thickness of 20 nanometers and grown by ALD.

Furthermore, two comparative examples are made. The thin film transistors of comparative examples 10-11 and example VI have similar structure except the dielectric layer 103. In comparative example 10, the dielectric layer 103 is a single layer structure as shown in FIG. 7, which is an Al$_2$O$_3$ layer with a thickness of 20 nanometers and grown by ALD. In comparative example 11, the first sub-dielectric layer 1031 is an Al$_2$O$_3$ layer with a thickness of 20 nanometers and grown by ALD, and the second sub-dielectric layer 1032 is a SiO$_2$ layer with a thickness of 20 nanometers and grown by magnetron sputtering. The current hysteresis of comparative examples 10-11 and example VI in example VI are tested and shown in FIGS. 22-24 and table 6 below.

TABLE 6

Comparison between example VI and comparative example(s)

| | dielectric layer | | | |
|---|---|---|---|---|
| | first sub-dielectric layer | second sub-dielectric layer | current hysteresis | polarity |
| comparative example 10 | Al$_2$O$_3$ by ALD | | large | ambipolar |
| comparative example 11 | Al$_2$O$_3$ by ALD | SiO$_2$ by magnetron sputtering | not reduced | ambipolar |
| example VI | SiO$_2$ by magnetron sputtering | Al$_2$O$_3$ by ALD | obviously reduced, even free | ambipolar |

Figure 22:
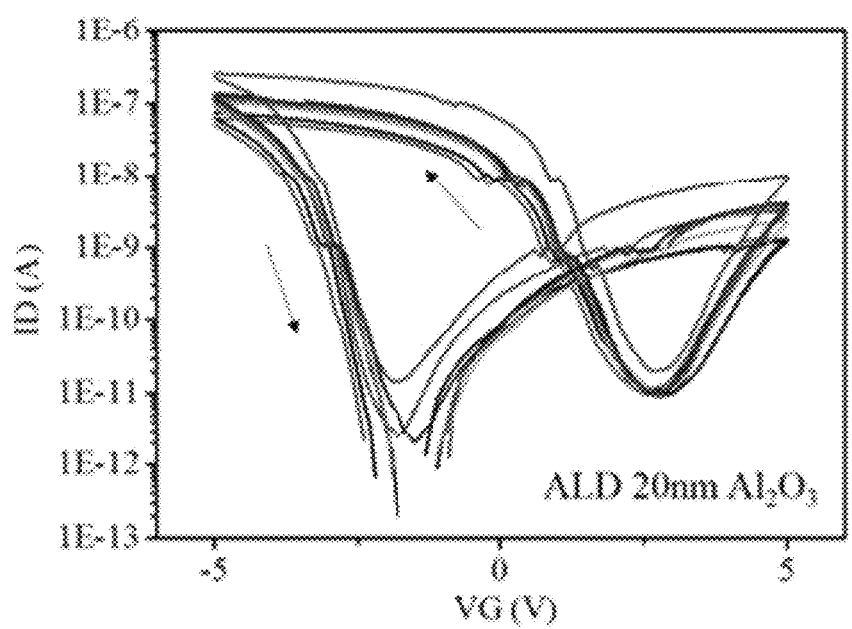
FIG. 22 is a diagram showing current hysteresis of a thin film transistor of comparative example 10.
Figure 23:
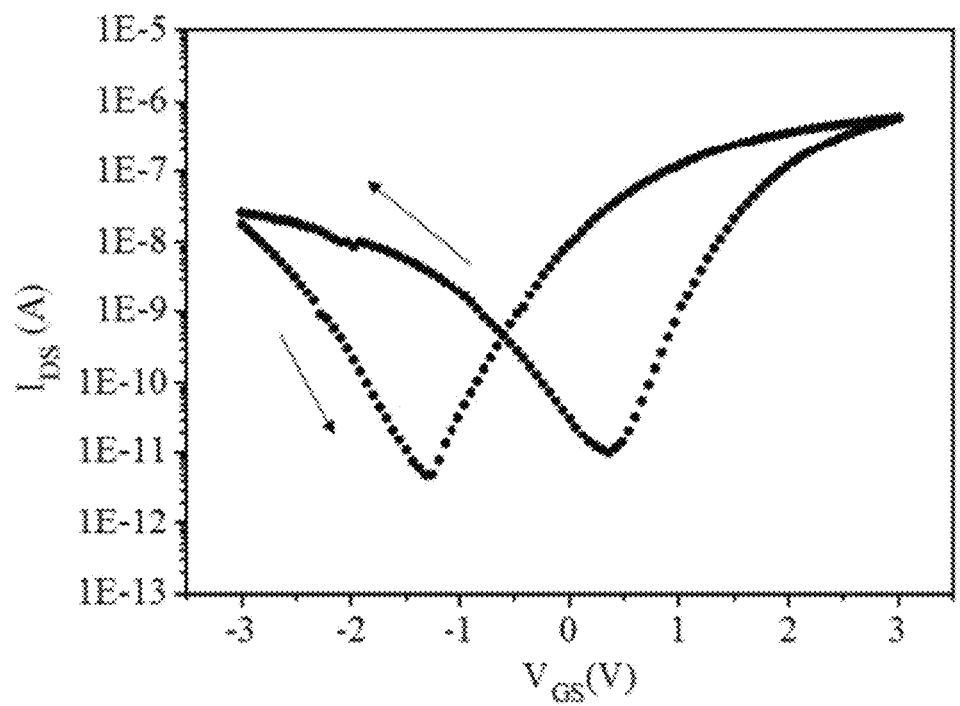
FIG. 23 is a diagram showing current hysteresis of a thin film transistor of comparative example 11.
Figure 24:
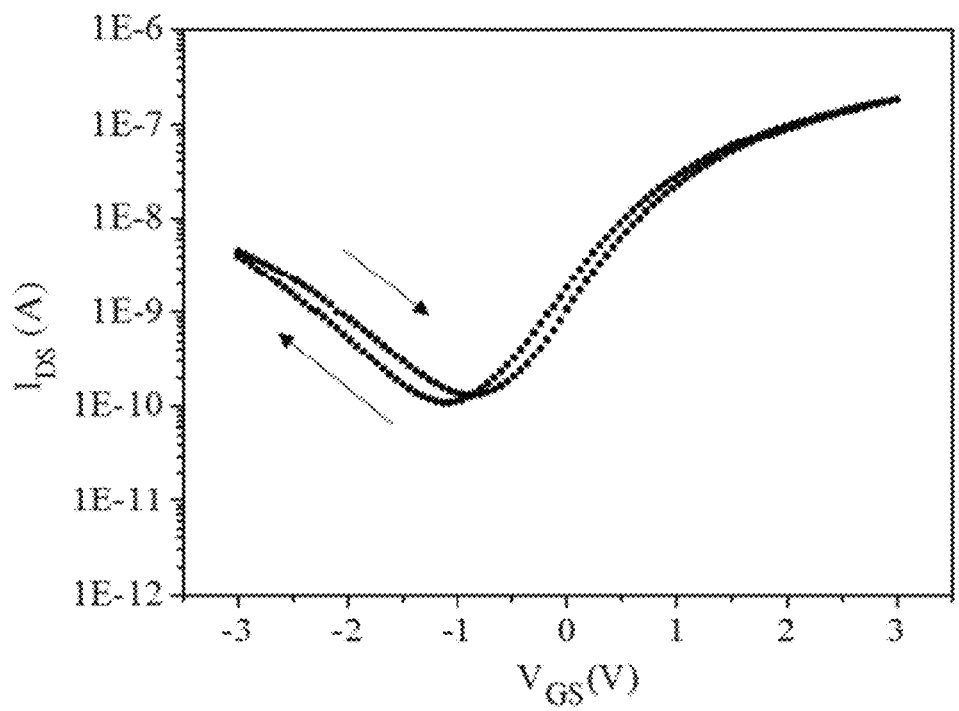
FIG. 24 is a diagram showing current hysteresis of the thin film transistor of example VI.

As shown in table 6 above, all the thin film transistors of comparative examples 10-11 and example VI are ambipolar. As shown in FIGS. 22-23, thin film transistors of comparative examples 10-11 have obvious large normal current hysteresis. As shown in FIG. 24, the current hysteresis of the thin film transistor in example VI is reduced and even free. It is also found that only when the abnormal dielectric layer is in direct contact with the gate 102, the abnormal dielectric layer can produce an abnormal current hysteresis to neutralize the normal current hysteresis produced by the normal dielectric layer. Thus, the current hysteresis of the thin film transistor in example VI is eliminated.

Example VII

The thin film transistor 100C in example VII is similar to the thin film transistor 100C in example V except that the first sub-dielectric layer 1031 is a $SiO_2$ layer with a thickness of 20 nanometers and grown by magnetron sputtering, and the second sub-dielectric layer 1032 is an $Si_3N_4$ layer with a thickness of 20 nanometers and grown by PECVD.

Furthermore, two comparative examples are made. The thin film transistors of comparative examples 12-13 and example VII have similar structure except the dielectric layer 103. In comparative example 12, the dielectric layer 103 is a single layer structure as shown in FIG. 7, which is a $Si_3N_4$ layer with a thickness of 20 nanometers and grown by PECVD. In comparative example 13, the first sub-dielectric layer 1031 is a $Si_3N_4$ layer with a thickness of 20 nanometers and grown by PECVD, and the second sub-dielectric layer 1032 is a $SiO_2$ layer with a thickness of 20 nanometers and grown by magnetron sputtering. The current hysteresis of comparative examples 12-13 and example VII in example VII are tested and shown in FIGS. 25-26 and table 7 below.

TABLE 7

Comparison between example VII and comparative example(s)

| | dielectric layer | | | |
| --- | --- | --- | --- | --- |
| | first sub-dielectric layer | second sub-dielectric layer | current hysteresis | polarity |
| comparative example 12 | $Si_3N_4$ by PECVD | | large | n-type |
| comparative example 13 | $Si_3N_4$ by PECVD | $SiO_2$ by magnetron sputtering | — | ambipolar |
| example VII | $SiO_2$ by magnetron sputtering | $Si_3N_4$ by PECVD | obviously reduced, even free | n-type |

Figure 25:
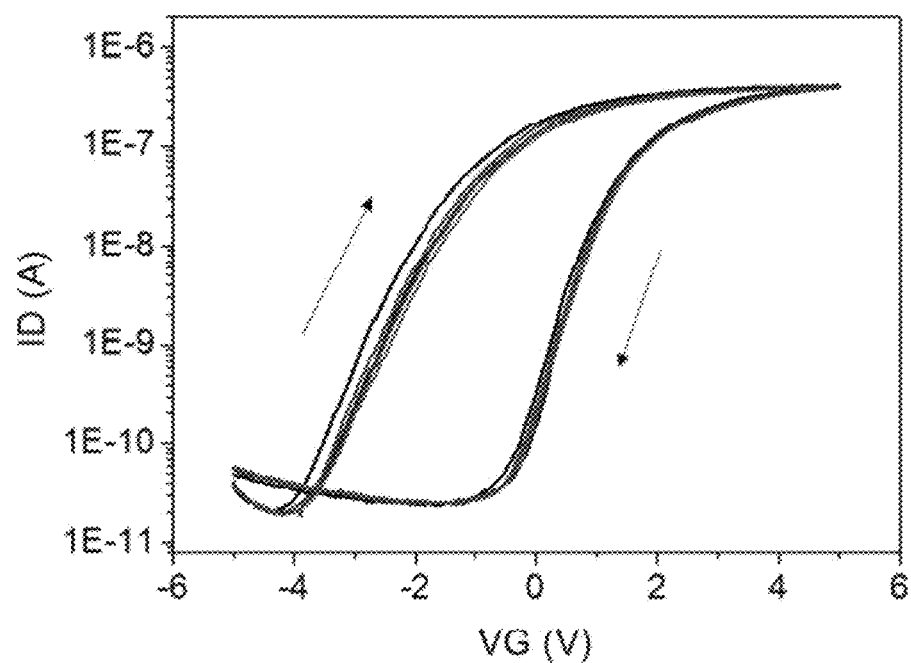
FIG. 25 is a diagram showing current hysteresis of a thin film transistor of comparative example 12.
Figure 26:
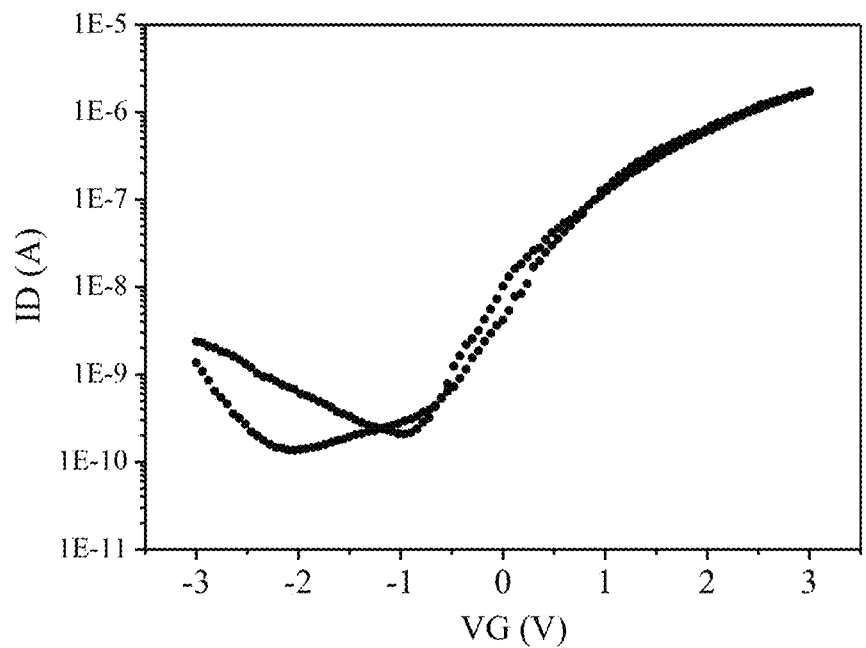
FIG. 26 is a diagram showing current hysteresis of the thin film transistor of example VII.

As shown in table 7 above, both the thin film transistors of comparative example 12 and example VII are n-type, and the thin film transistor of comparative example 13 is ambipolar. The clockwise current hysteresis which is defined as normal current hysteresis of n-type thin film transistor. The anticlockwise current hysteresis which is defined as abnormal current hysteresis or inverse current hysteresis of n-type thin film transistor. As shown in FIG. 25, thin film transistor of comparative example 12 has obvious large normal current hysteresis. As shown in FIG. 26, the current hysteresis of the thin film transistor in example VII is reduced and even free. It is also found that when the $SiO_2$ abnormal dielectric layer is in direct contact with the gate 102, the abnormal dielectric layer can produce an abnormal current hysteresis to neutralize the normal current hysteresis produced by the $Si_3N_4$ normal dielectric layer.

Example VIII

The thin film transistor 100C in example VIII is similar to the thin film transistor 100C in example V except that the first sub-dielectric layer 1031 is a $SiO_2$ layer with a thickness of 20 nanometers and grown by magnetron sputtering, and the second sub-dielectric layer 1032 is a $SiO_2$ layer with a thickness of 20 nanometers and grown by electron beam evaporation.

Furthermore, one comparative example 14 is made. The thin film transistors of comparative example 14 and example VIII have similar structure except the dielectric layer 103. In comparative example 14, the first sub-dielectric layer 1031 is a $SiO_2$ layer with a thickness of 20 nanometers and grown by electron beam evaporation, and the second sub-dielectric layer 1032 is a $SiO_2$ layer with a thickness of 20 nanometers and grown by magnetron sputtering. The current hysteresis of comparative example 14 and example VIII are tested and shown in FIGS. 27-28 and table 8 below.

TABLE 8

Comparison between example VIII and comparative example(s)

| | dielectric layer | | | |
| --- | --- | --- | --- | --- |
| | first sub-dielectric layer | second sub-dielectric layer | current hysteresis | polarity |
| comparative example 14 | $SiO_2$ by electron beam evaporation | $SiO_2$ by magnetron sputtering | not reduced | p-type |
| example VIII | $SiO_2$ by magnetron sputtering | $SiO_2$ by electron beam evaporation | obviously reduced, even free | p-type |

Figure 27:
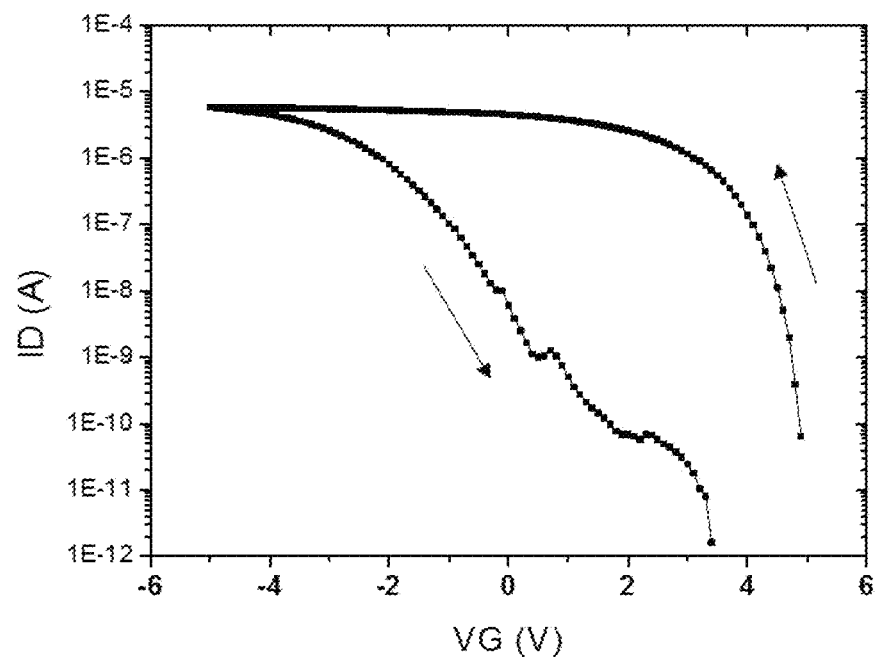
FIG. 27 is a diagram showing current hysteresis of a thin film transistor of comparative example 14.
Figure 28:
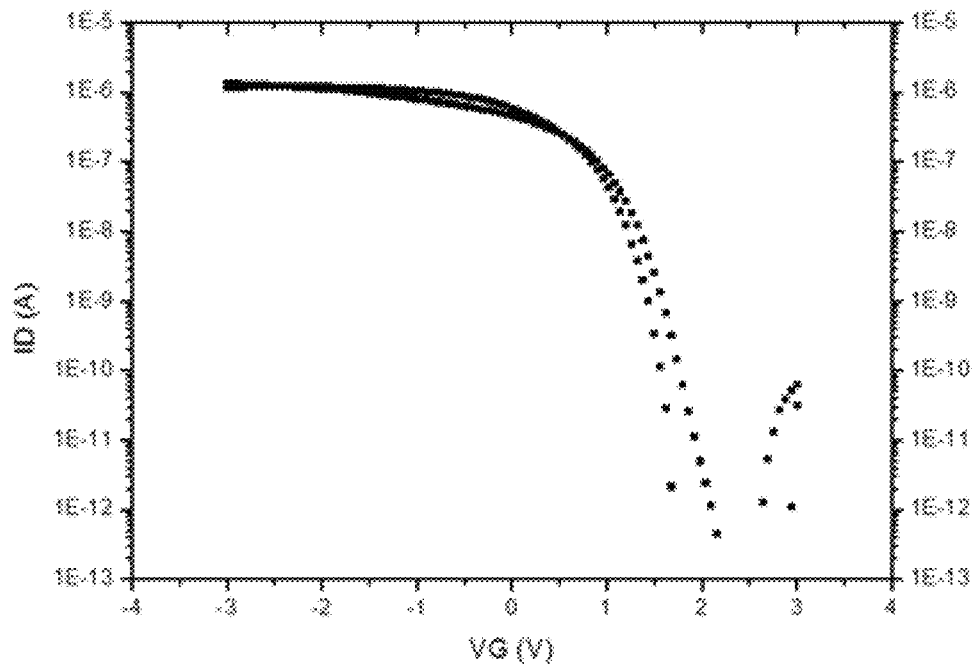
FIG. 28 is a diagram showing current hysteresis of the thin film transistor of example VIII.

As shown in table 8 above, both the thin film transistors of comparative example 14 and example VIII are p-type. As shown in FIG. 27, thin film transistor of comparative example 14 has obvious large normal current hysteresis. As shown in FIG. 28, the current hysteresis of the thin film transistor in example VIII is reduced and even free. It is also found that when the $SiO_2$ abnormal dielectric layer is in direct contact with the gate 102, the abnormal dielectric layer can produce an abnormal current hysteresis to neutralize the normal current hysteresis produced by the $SiO_2$ normal dielectric layer.

Example IX

The thin film transistor 100A in example IX is similar to the thin film transistor 100A in example II except that the semiconductor layer 104 includes a plurality of semiconducting $MoS_2$ sheets.

In present exemplary embodiment, one sample of the thin film transistors 100A is made. The dielectric layers 103 is a $SiO_2$ layer with a thickness of 20 nanometers and grown by magnetron sputtering, and the semiconductor layer 104 is made by depositing a plurality of semiconducting $MoS_2$ sheets.

Furthermore, two comparative examples 15-16 are made. The thin film transistors of comparative example 15 and example IX have similar structure except that comparative example 15 is a back-gate structure as shown in FIG. 1, and the dielectric layer 103 of comparative example 15 is a $SiO_2$ layer with a thickness of 20 nanometers and grown by thermal oxidation. The thin film transistors of comparative example 16 and example IX have similar structure except that, in comparative example 16, the dielectric layer 103 is an $Al_2O_3$ layer with a thickness of 20 nanometers and grown by ALD. The current hysteresis of comparative examples 16-17 and example IX are tested and shown in FIGS. 27-28 and table 9 below.

TABLE 9

Comparison between example IX and comparative example(s)

| | dielectric layer | | current | |
| --- | --- | --- | --- | --- |
| | material | method | hysteresis | polarity |
| comparative example 15 | SiO$_2$ | thermal oxidation | clockwise | n-type |
| comparative example 16 | Al$_2$O$_3$ | ALD | clockwise | n-type |
| example IX | SiO$_2$ | magnetron sputtering | anticlockwise | n-type |

Figure 29:
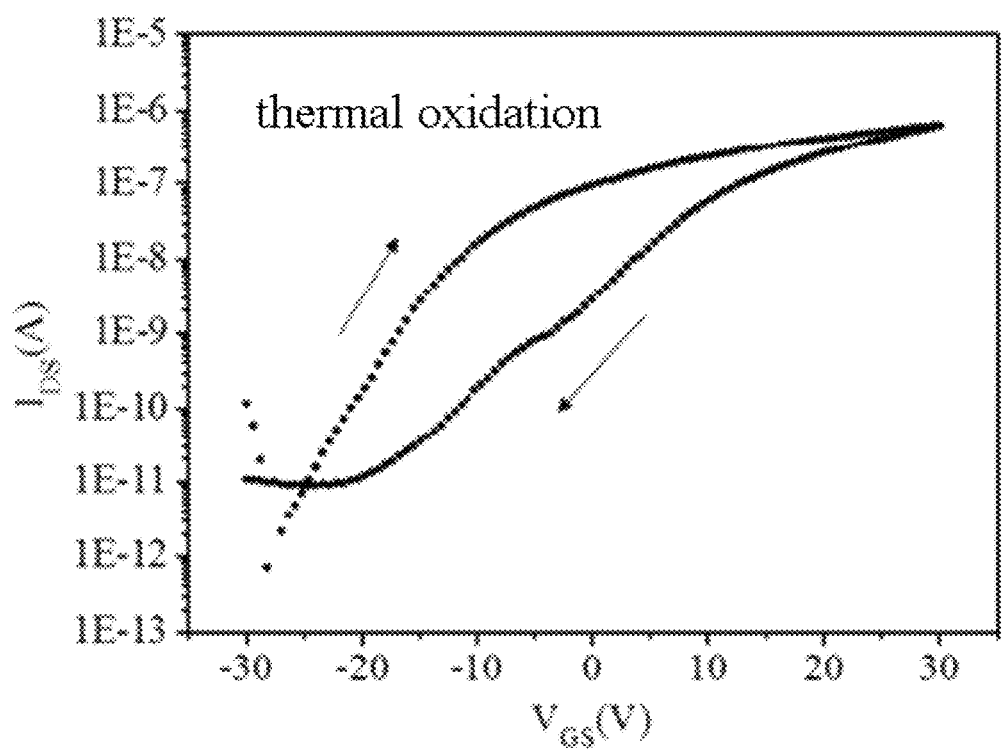
FIG. 29 is a diagram showing current hysteresis of a thin film transistor of comparative example 15.
Figure 30:
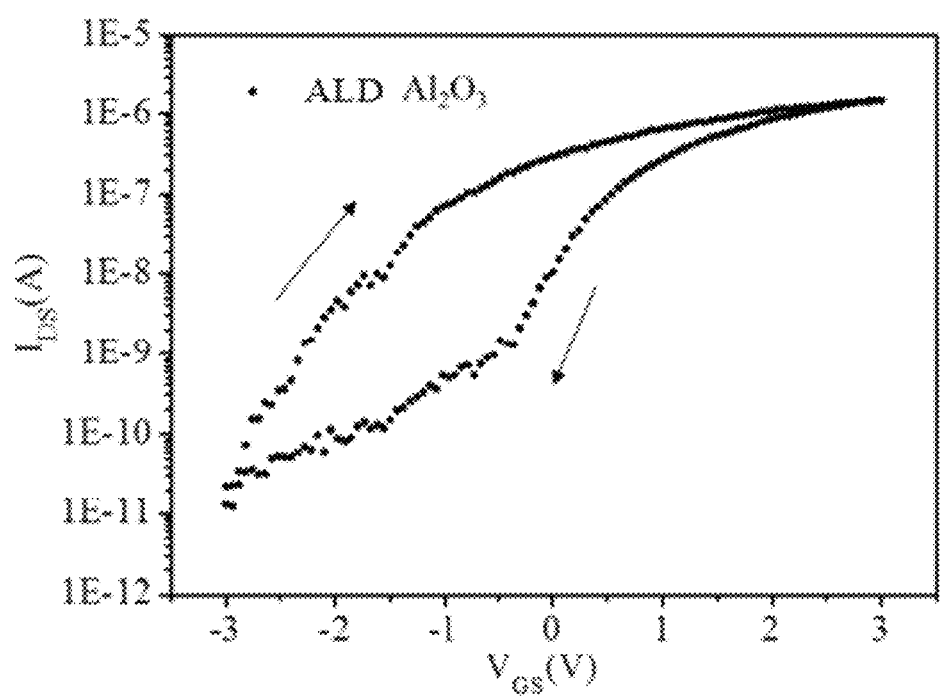
FIG. 30 is a diagram showing current hysteresis of a thin film transistor of comparative example 16.
Figure 31:
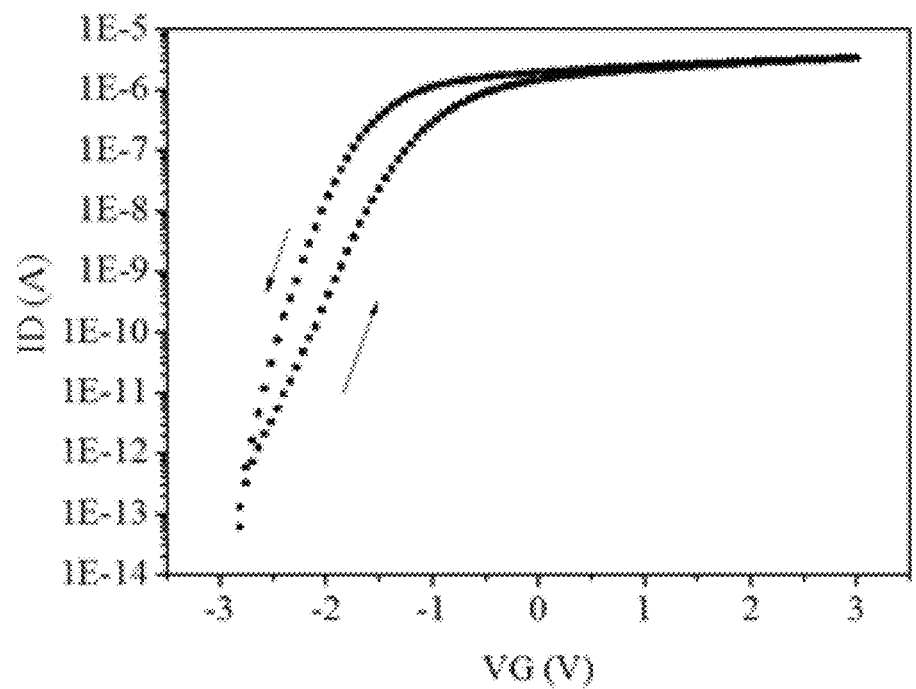
FIG. 31 is a diagram showing current hysteresis of the thin film transistor of example IX.

As shown in table 9 above, all the thin film transistors of comparative examples 15-16 and example IX are n-type. As shown in FIGS. 29-30, thin film transistors of comparative examples 15-16 have normal clockwise current hysteresis. As shown in FIG. 31, the current hysteresis of the thin film transistor in example IX has abnormal anticlockwise current hysteresis. It is found that the oxide dielectric layers grown by magnetron sputtering is also an abnormal dielectric layer for the semiconductor layer 104 including other nano-scaled semiconductor materials such as MoS$_2$ sheets.

Example X

The thin film transistor 100C in example X is similar to the thin film transistor 100C in example V except that the first sub-dielectric layer 1031 is a SiO$_2$ layer with a thickness of 20 nanometers and grown by magnetron sputtering, and the second sub-dielectric layer 1032 is an Al$_2$O$_3$ layer with a thickness of 20 nanometers and grown by ALD.

Furthermore, one comparative example 17 is made. The thin film transistors of comparative example 17 and example X have similar structure except the dielectric layer 103. In comparative example 17, the first sub-dielectric layer 1031 is a Al$_2$O$_3$ layer with a thickness of 20 nanometers and grown by ALD, and the second sub-dielectric layer 1032 is a SiO$_2$ layer with a thickness of 20 nanometers and grown by magnetron sputtering. The current hysteresis of comparative example 17 and example X are tested and shown in FIGS. 32-33 and table 10 below.

TABLE 10

Comparison between example X and comparative example(s)

| | dielectric layer | | | |
| --- | --- | --- | --- | --- |
| | first sub-dielectric layer | second sub-dielectric layer | current hysteresis | polarity |
| comparative example 17 | Al$_2$O$_3$ by ALD | SiO$_2$ by magnetron sputtering | not reduced | n-type |
| example X | SiO$_2$ by magnetron sputtering | Al$_2$O$_3$ by ALD | obviously reduced, even free | n-type |

Figure 32:
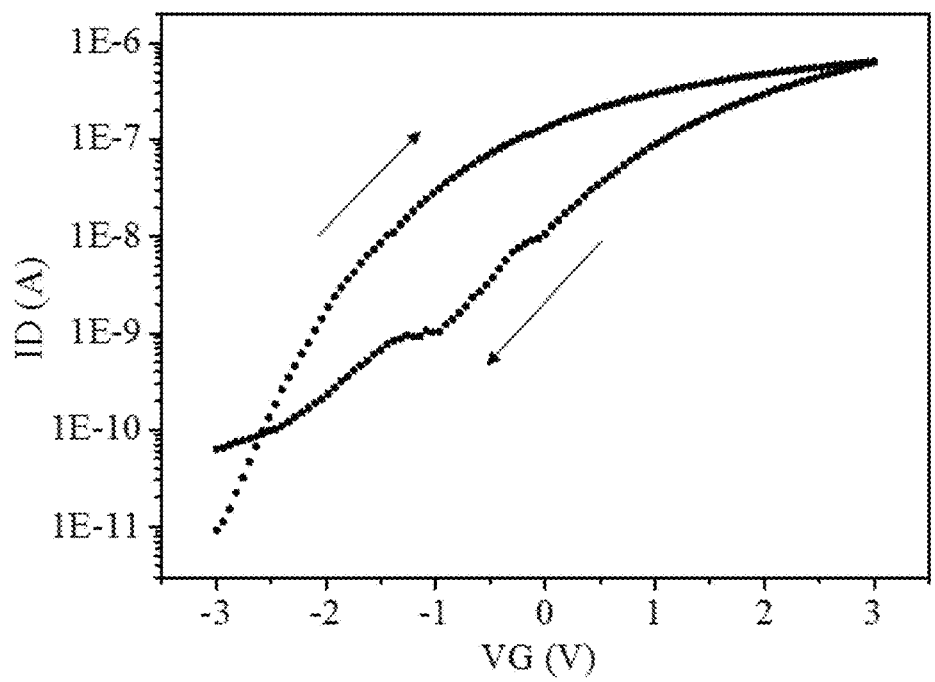
FIG. 32 is a diagram showing current hysteresis of a thin film transistor of comparative example 17.
Figure 33:
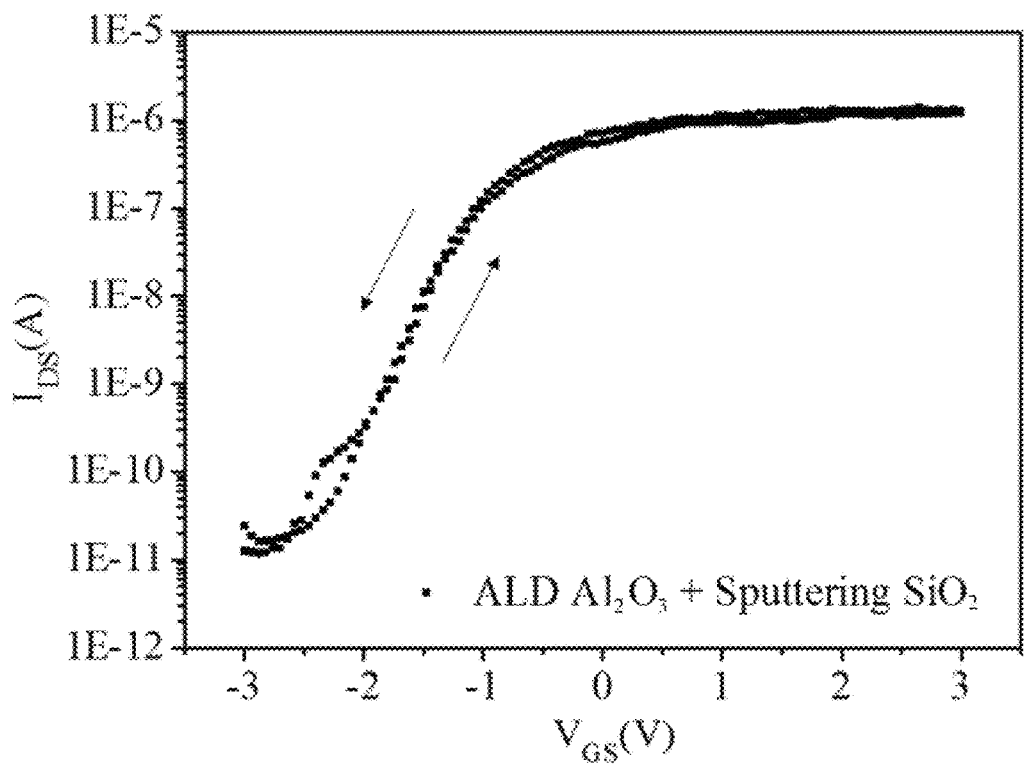
FIG. 33 is a diagram showing current hysteresis of the thin film transistor of example X.

As shown in table 10 above, both the thin film transistors of comparative example 17 and example X are n-type. As shown in FIG. 32, thin film transistor of comparative example 17 has obvious large normal current hysteresis. As shown in FIG. 33, the current hysteresis of the thin film transistor in example X is reduced and even free. It is also found that when the SiO$_2$ abnormal dielectric layer is in direct contact with the gate 102, the abnormal dielectric layer can produce an abnormal current hysteresis to neutralize the normal current hysteresis produced by the Al$_2$O$_3$ normal dielectric layer.

Example XI

The thin film transistor 100 in example XI is similar to the thin film transistor 100 in example I except that the dielectric layer 103 is an Al$_2$O$_3$ layer grown by magnetron sputtering.

In present exemplary embodiment, five samples of the thin film transistors 100 are made. The five samples have similar structure except that the thicknesses of the Al$_2$O$_3$ dielectric layers 103 are respectively 10 nanometers, 20 nanometers, 100 nanometers, 500 nanometers, and 1000 nanometers.

Figure 34:
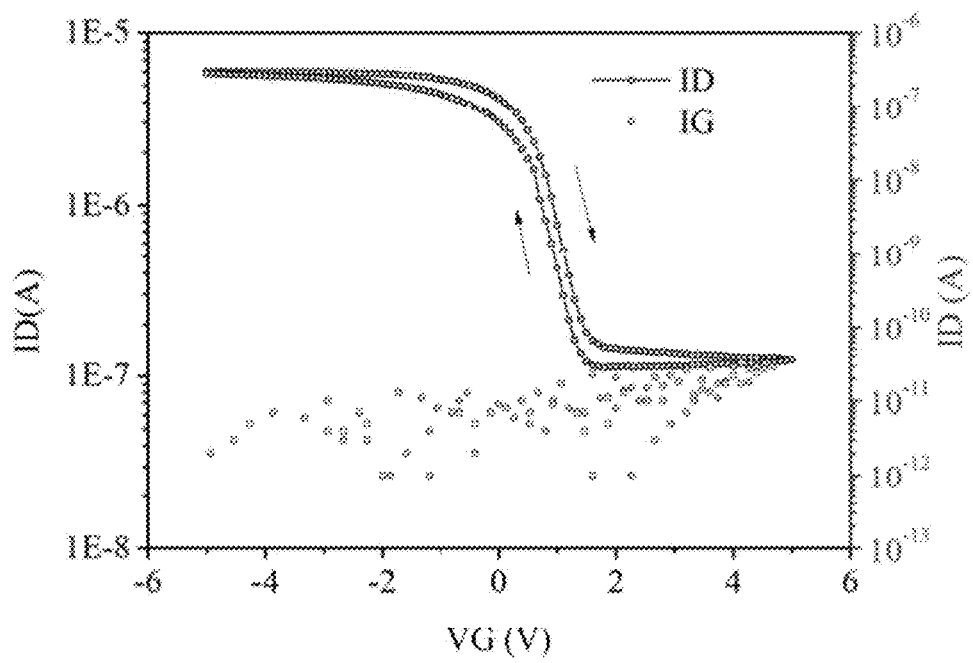
FIG. 34 is a diagram showing current hysteresis of the thin film transistor of example XI.

The current hysteresis of the thin film transistors in example XI are tested, compared with comparative examples 2-3 above, and shown in FIG. 34 and table 11 below.

TABLE 11

Comparison between example XI and comparative example(s)

| | dielectric layer | | current | |
| --- | --- | --- | --- | --- |
| | material | method | hysteresis | polarity |
| comparative example 2 | Al$_2$O$_3$ | electron beam evaporation | anticlockwise | p-type |
| comparative example 3 | Al$_2$O$_3$ | ALD | anticlockwise | p-type |
| example XI | Al$_2$O$_3$ | magnetron sputtering | clockwise | p-type |

Figure 3:
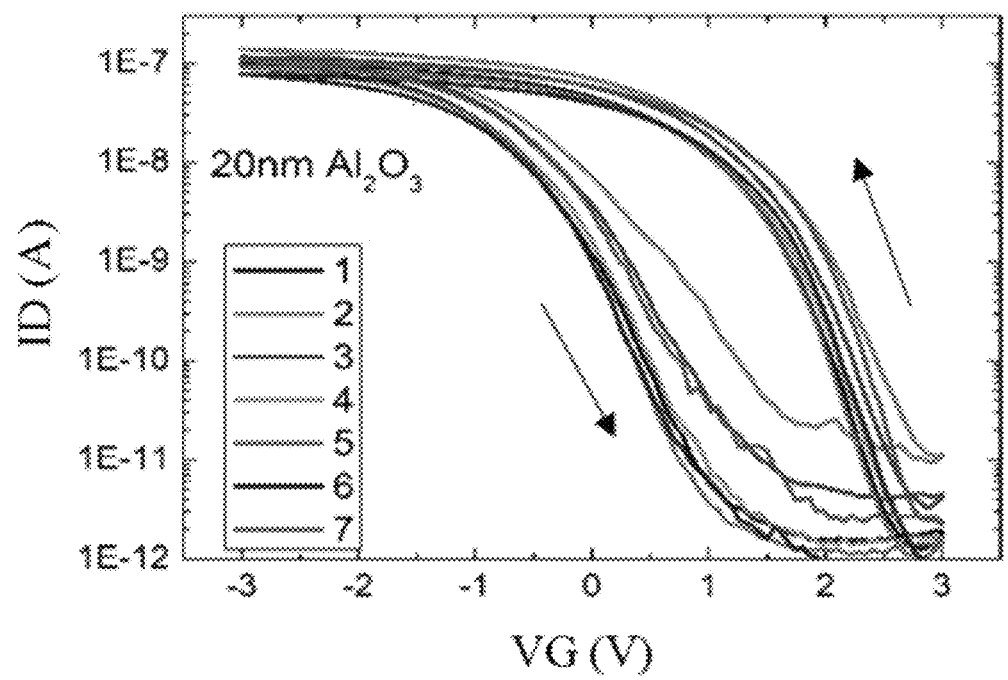
FIG. 3 is a diagram showing current hysteresis of a thin film transistor of comparative example 2.

As shown in table 11 above, all the thin film transistors of comparative examples 2-3 and example XI are p-type. As shown in FIG. 34, thin film transistor in example XI has abnormal clockwise current hysteresis. However, the thin film transistors of comparative examples 2-3 have normal anticlockwise current hysteresis as shown in FIGS. 3-4. It is found that the Al$_2$O$_3$ layer grown by magnetron sputtering is an abnormal dielectric layer. When the Al$_2$O$_3$ layer grown by magnetron sputtering is stacked on a normal dielectric layer and in direct contact with the gate 102, Al$_2$O$_3$ abnormal dielectric layer can produce an abnormal current hysteresis to neutralize the normal current hysteresis produced by the normal dielectric layer.

Example XII

Figure 35:
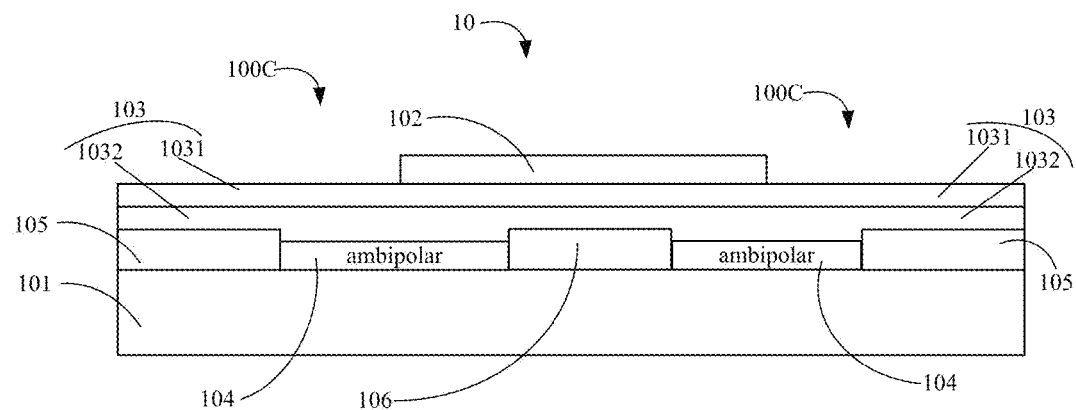
FIG. 35 is a cross-sectional view of example XII of a logic circuit.

Referring to FIG. 35, in example XII, a logic circuit 10 using two thin film transistors 100C above is provided. The logic circuit 10 is a CMOS-like inverter that includes two ambipolar thin film transistors 100C. In the thin film transistor 100C, the current hysteresis is reduced and even free. The thin film transistor 100C is top-gate type and includes a substrate 101, a gate 102, a dielectric layer 103, a semiconductor layer 104, a source 105, and a drain 106. The dielectric layer 103 is a double-layer structure and includes a first sub-dielectric layer 1031 and a second sub-dielectric layer 1032 stacked on one another. The first sub-dielectric layer 1031 is an abnormal dielectric layer and the second sub-dielectric layer 1032 is a normal dielectric layer. The gates 102 of the two thin film transistors 100C are electrically connected with each other. The sources 105 or drains 106 of the two thin film transistors 100C are electrically connected with each other.

In present exemplary embodiment, the two thin film transistors 100C share a common substrate 101, a common drain 106, and a common gate 102. The semiconductor layers 104 of the two thin film transistors 100C are made by patterning a continuous single-walled carbon nanotube layer. The first sub-dielectric layers 1031 of the two thin film transistors 100C are formed by the same deposition process and form a continuous layer structure. The second sub-dielectric layers 1032 of the two thin film transistors 100C are also formed by the same deposition process and form a continuous layer structure. The dielectric layer 103 consists of the first sub-dielectric layer 1031 and the second sub-dielectric layer 1032. The first sub-dielectric layer 1031 is a $SiO_2$ layer with a thickness of 20 nanometers and grown by magnetron sputtering, and the second sub-dielectric layer 1032 is an $Al_2O_3$ layer with a thickness of 20 nanometers and grown by ALD.

Furthermore, one comparative example 18 is made. The logic circuits of comparative example 18 and example XII have similar structure except the dielectric layer 103. In comparative example 18, first sub-dielectric layer 1031 is an $Al_2O_3$ layer with a thickness of 20 nanometers and grown by ALD, and the second sub-dielectric layer 1032 is a $SiO_2$ layer with a thickness of 20 nanometers and grown by magnetron sputtering.

The current hysteresis, voltage transfer characteristic, and frequency response of the logic circuits of comparative example 18 and example XII are tested and shown in FIGS. 36-40 and table 12 below.

TABLE 12

Comparison between example XII and comparative example(s)

| | dielectric layer | | | | |
| --- | --- | --- | --- | --- | --- |
| | first sub-dielectric layer | second sub-dielectric layer | current hysteresis | threshold voltage | frequency response |
| comparative example 18 | $Al_2O_3$ by ALD | $SiO_2$ by magnetron sputtering | large | >1 V | unstable |
| example XII | $SiO_2$ by magnetron sputtering | $Al_2O_3$ by ALD | small, even free | about 0.1 V | stable |

Figure 36:
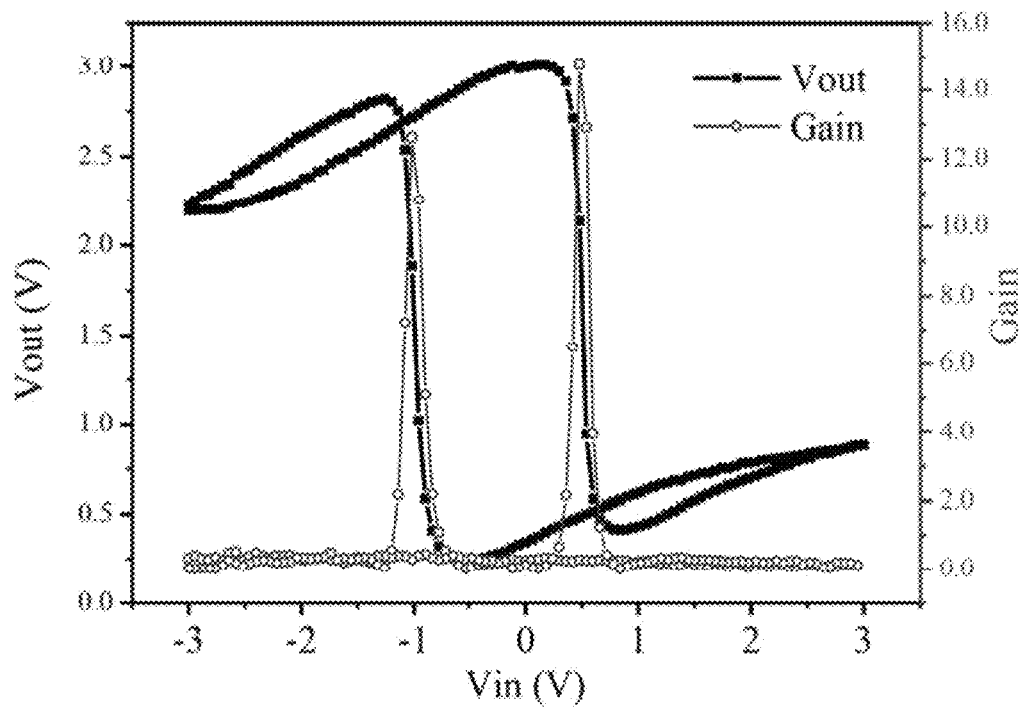
FIG. 36 is a diagram showing a voltage transfer characteristic of a logic circuit of comparative example 18.
Figure 37:
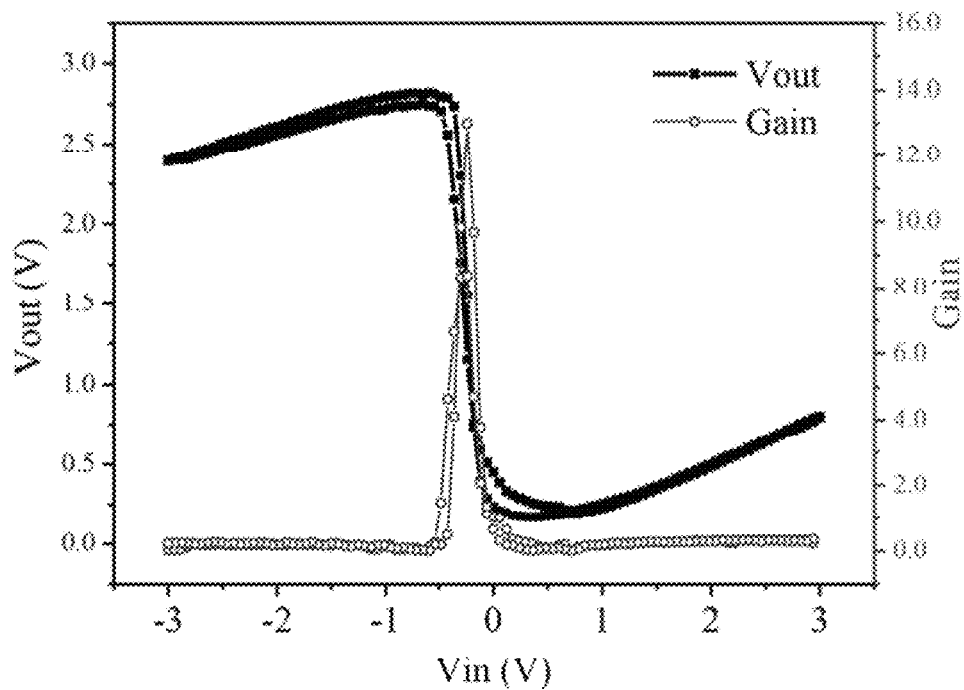
FIG. 37 is a diagram showing a voltage transfer characteristic of the logic circuit in example XII.
Figure 38:
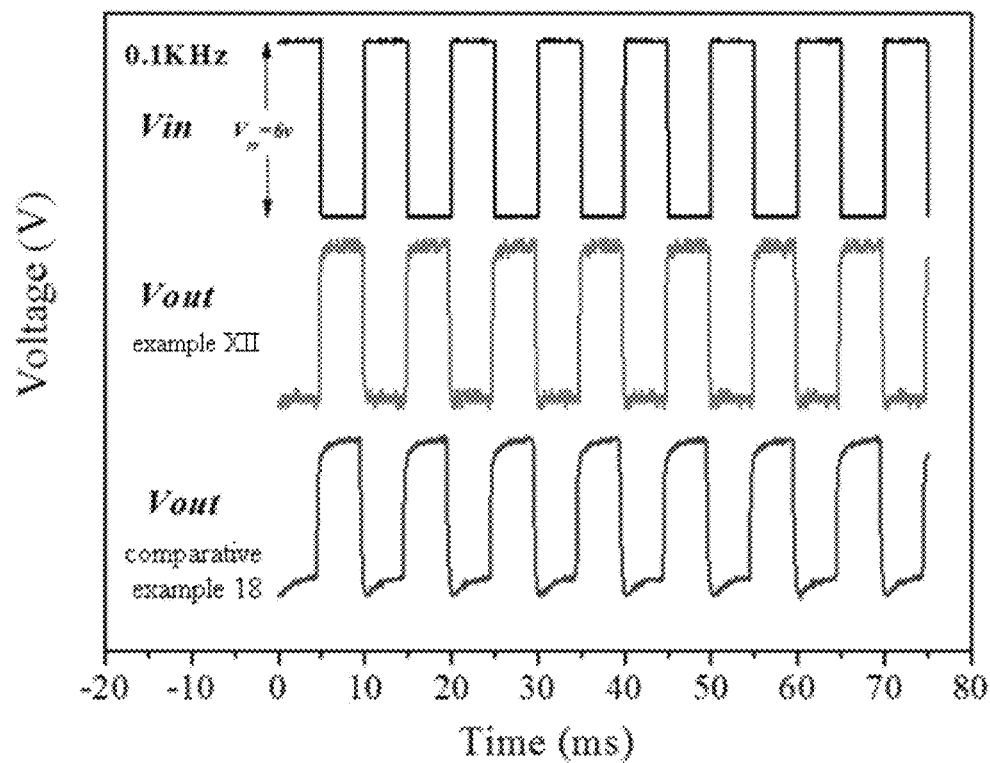
FIG. 38 is a diagram showing a frequency response comparison between the logic circuit in example XII and the logic circuit of comparative example 18, where the input wave is 0.1 kHz square wave.
Figure 39:
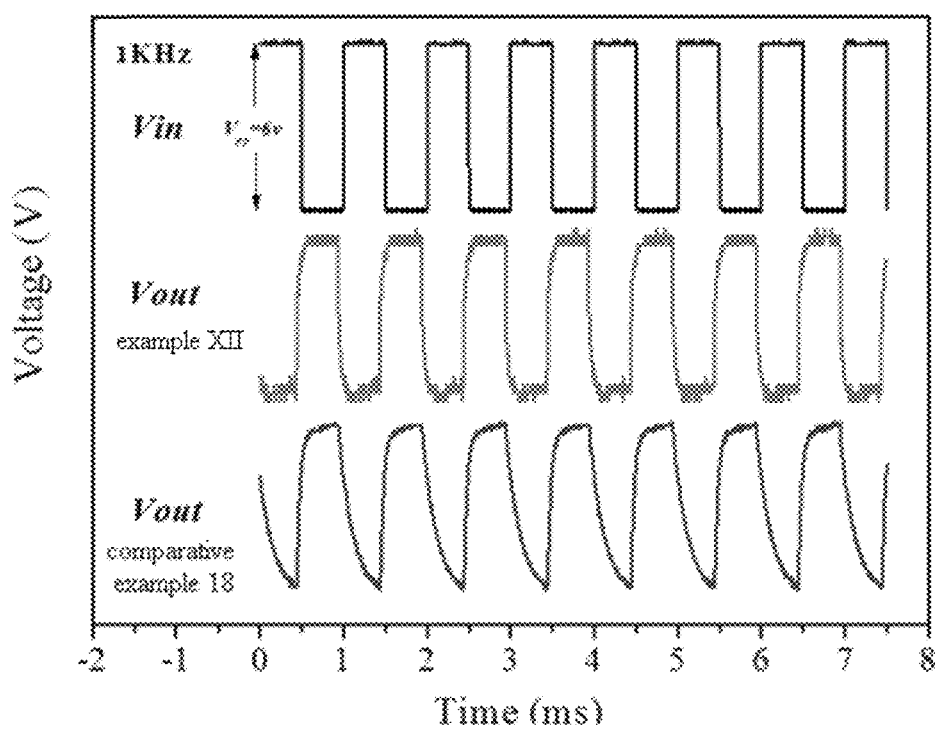
FIG. 39 is a diagram showing a frequency response comparison between the logic circuit in example XII and the logic circuit of comparative example 18, where the input wave is 1 kHz square wave.

As shown in table 12 and FIGS. 36-37, the difference between the transfer threshold voltages of the same device under different sweep directions to be 1.5 V/6 V and 0.01 V/6 V, respectively, can be determined. There is a difference of approximately 150 times between the two transfer thresholds.

For the two types of inverter of comparative example 18 and example XII, square waves with $V_{dd}$=6 V and frequencies of 0.1 kHz and 1 kHz were used as the input signals, respectively, and the output signals were measured to calculate the maximum operating frequencies of these inverters. From FIGS. 38-39, it can be found that while the mobility of the single CNT-TFTs are the same, their output signals are quite different. It is clear that the output signal of the inverters of comparative example 18 with larger current hysteresis is more anamorphic than that of the smaller current hysteresis device of example XII at both 0.1 kHz and 1 kHz.

Figure 40:
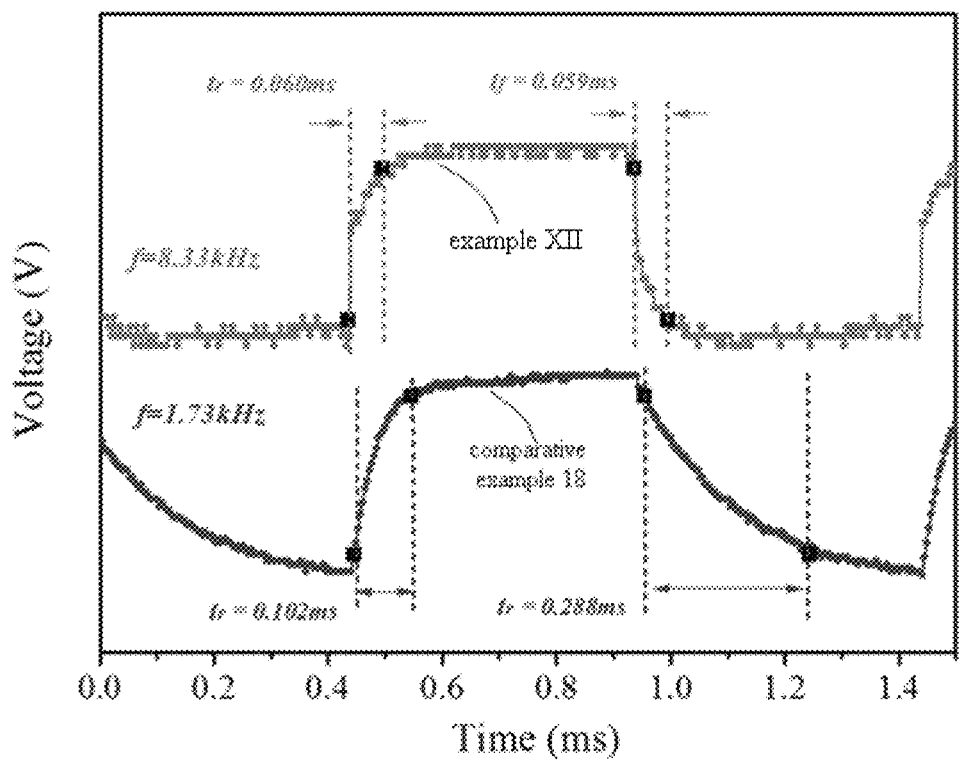
FIG. 40 is a diagram showing a maximum operating frequency calculated using a single output wave of the FIG. 39.

As shown in FIG. 40, the edge delay time of the normal large-current hysteresis inverter of comparative example 18 is greater than the edge delay time of the small-current hysteresis inverter of example XII. Additionally, the maximum operating frequencies of these inverters can be calculated using the formula f=1/max ($t_r$, $t_f$), where $t_r$ represents the rising edge delay time and $t_f$ represents the falling edge delay time (where $t_r$ and $t_f$ are defined by the time differences between 10% above the low level and 10% below the high level). As a result, the maximum operating frequencies of the normal large-current hysteresis inverter of comparative example 18 of and small-current hysteresis inverter of example XII that were constructed using the same-mobility CNT-TFTs are 1.73 kHz and 8.33 kHz, respectively, which proves that the small-current hysteresis CNT-TFTs are more reliable for practical applications.

Example XIII

Figure 41:
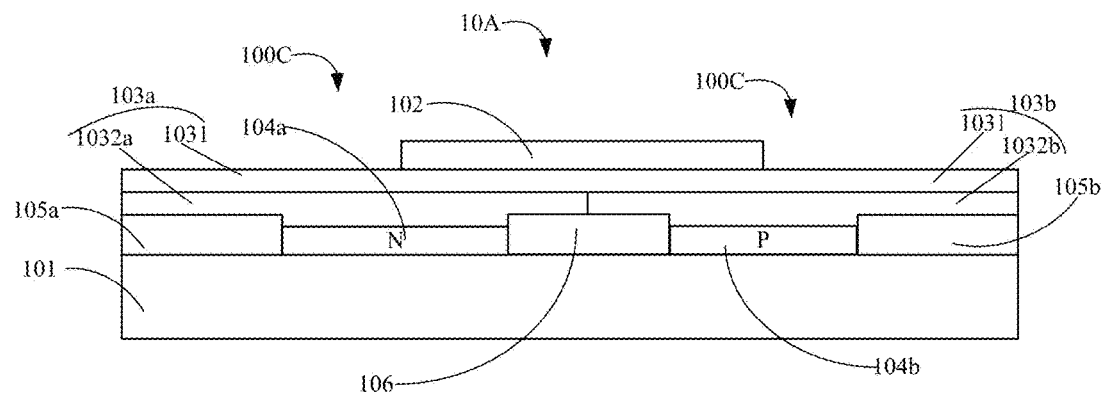
FIG. 41 is a cross-sectional view of example XIII of a logic circuit.

Referring to FIG. 41, in example XIII, a logic circuit 10A using two thin film transistors 100C above is provided. The logic circuit 10A is a CMOS-like inverter includes a p-type thin film transistor 100C and an n-type thin film transistor 100C located side by side. In the thin film transistor 100C, the current hysteresis is reduced and even free. The n-type thin film transistor 100C is top-gate type and includes a substrate 101, a gate 102, a dielectric layer 103a, a semiconductor layer 104a, a source 105a, and a drain 106. The dielectric layer 103a is a double-layer structure and includes a first sub-dielectric layer 1031 and a second sub-dielectric layer 1032a stacked on one another. The first sub-dielectric layer 1031 is an abnormal dielectric layer, and the second sub-dielectric layer 1032a is a normal dielectric layer. The p-type thin film transistor 100C is top-gate type and includes a substrate 101, a gate 102, a dielectric layer 103b, a semiconductor layer 104b, a source 105b, and a drain 106. The dielectric layer 103b is a double-layer structure and includes a first sub-dielectric layer 1031 and a second sub-dielectric layer 1032b stacked on one another. The first sub-dielectric layer 1031 is an abnormal dielectric layer, and the second sub-dielectric layer 1032b is a normal dielectric layer. The gates 102 of the p-type thin film transistor 100C and the n-type thin film transistor 100C are electrically connected with each other. The sources 105 or drains 106 of the p-type thin film transistor 100C and the n-type thin film transistor 100C are electrically connected with each other.

In present exemplary embodiment, the p-type thin film transistor 100C and the n-type thin film transistor 100C share a common substrate 101, a common drain 106, and a common gate 102. The semiconductor layer 104a and the semiconductor layer 104b can be the same and made by patterning a continuous single-walled carbon nanotube layer. The first sub-dielectric layers 1031 of the p-type thin film transistor 100C and the n-type thin film transistor 100C are formed by the same deposition process and form a continuous layer structure. The second sub-dielectric layer 1032a and the second sub-dielectric layer 1032b are different normal dielectric layer. The first sub-dielectric layer 1031 is a $SiO_2$ layer with a thickness of 20 nanometers and grown by magnetron sputtering, the second sub-dielectric layer 1032a is a $Si_3N_4$ layer with a thickness of 20 nanometers and grown by PECVD, and the second sub-dielectric layer 1032b is an $Y_2O_3$ layer with a thickness of 20 nanometers and grown by thermal oxidation.

Example XIV

Figure 42:
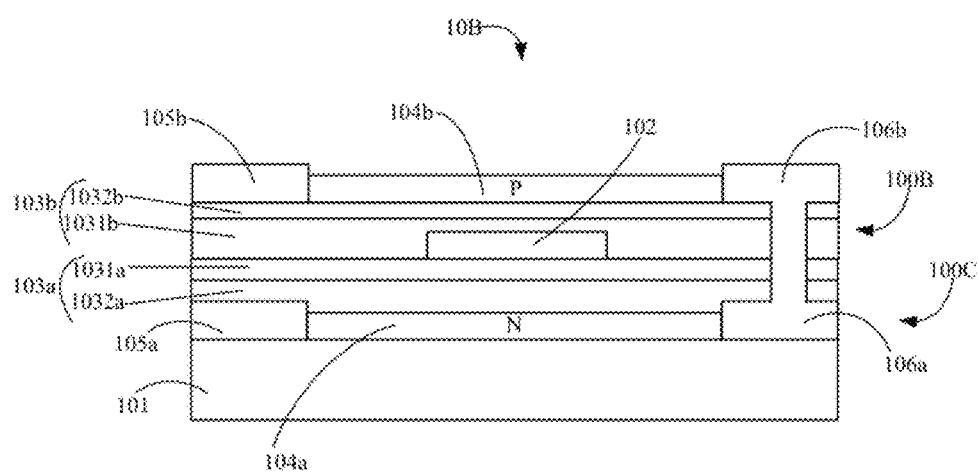
FIG. 42 is a cross-sectional view of example XIV of a logic circuit.

Referring to FIG. 42, in example XIV, a logic circuit 10B using a thin film transistor 100B and a thin film transistor 100C above is provided. The logic circuit 10B is a CMOS-like inverter includes a p-type thin film transistor 100B and an n-type thin film transistor 100C stacked on one another. In the thin film transistor 100B and thin film transistor 100C, the current hysteresis is reduced and even free. The n-type thin film transistor 100C is back-gate type and includes a substrate 101, a gate 102, a dielectric layer 103a, a semiconductor layer 104a, a source 105a, and a drain 106a. The dielectric layer 103a is a double-layer structure and includes a first sub-dielectric layer 1031a and a second sub-dielectric layer 1032a stacked on one another. The first sub-dielectric layer 1031a is an abnormal dielectric layer, and the second sub-dielectric layer 1032a is a normal dielectric layer. The p-type thin film transistor 100B is top-gate type and includes a substrate 101, a gate 102, a dielectric layer 103b, a semiconductor layer 104b, a source 105b, and a drain 106b. The dielectric layer 103b is a double-layer structure and includes a first sub-dielectric layer 1031b and a second sub-dielectric layer 1032b stacked on one another. The first sub-dielectric layer 1031b is an abnormal dielectric layer, and the second sub-dielectric layer 1032b is a normal dielectric layer. The gates 102 of the p-type thin film transistor 100B and the n-type thin film transistor 100C are electrically connected with each other. The source 105a and source 105b are electrically connected with each other, or the drain 106a and drain 106b are electrically connected with each other.

In present exemplary embodiment, the p-type thin film transistor 100B and the n-type thin film transistor 100C share a common substrate 101 and a common gate 102. The semiconductor layer 104a and the semiconductor layer 104b can be the same and made by different coating process. The gate 102 is sandwiched between and in direct contact with the first sub-dielectric layer 1031a and the first sub-dielectric layer 1031b. A through hole is defined by the dielectric layer 103a and dielectric layer 103b, and the drain 106b is electrically connected to the drain 106a by extending through the through hole. The first sub-dielectric layer 1031a and the first sub-dielectric layer 1031b are the same abnormal dielectric layer. The second sub-dielectric layer 1032a and the second sub-dielectric layer 1032b are different normal dielectric layer. Each of the first sub-dielectric layer 1031a and the first sub-dielectric layer 1031b is a $SiO_2$ layer with a thickness of 20 nanometers and grown by magnetron sputtering, the second sub-dielectric layer 1032a is a $Si_3N_4$ layer with a thickness of 20 nanometers and grown by PECVD, and the second sub-dielectric layer 1032b is an $Al_2O_3$ layer with a thickness of 20 nanometers and grown by ALD.

It is to be understood that the above-described exemplary embodiments are intended to illustrate rather than limit the disclosure. Any elements described in accordance with any exemplary embodiments is understood that they can be used in addition or substituted in other exemplary embodiments. Exemplary embodiments can also be used together. Variations may be made to the exemplary embodiments without departing from the spirit of the disclosure. The above-described exemplary embodiments illustrate the scope of the disclosure but do not restrict the scope of the disclosure.

Depending on the exemplary embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A thin film transistor, comprising:
   a substrate;
   a semiconductor layer on the substrate, wherein the semiconductor layer comprises at least one nano-scaled semiconductor material;
   a source and a drain, wherein the source and the drain are on the substrate, spaced apart from each other, and electrically connected to the semiconductor layer;
   a dielectric layer on the semiconductor layer, wherein the dielectric layer comprises a first sub-dielectric layer and a second sub-dielectric layer stacked on one another, and the first sub-dielectric layer is a first oxide dielectric layer grown by magnetron sputtering; and
   a gate in direct contact with the first sub-dielectric layer;
   wherein the first oxide dielectric layer is grown by magnetron sputtering and sandwiched between the second sub-dielectric layer and the gate; the second sub-dielectric layer is a second oxide dielectric layer or a nitride dielectric layer, the second sub-dielectric layer is grown using one of atomic layer deposition, electron beam evaporation, thermal oxidation, and plasma-enhanced chemical vapor deposition; and the current hysteresis caused by the first oxide dielectric layer is inverse to the current hysteresis caused by the second oxide dielectric layer or the nitride dielectric layer so that the thin film transistor has a reduced current hysteresis.

2. The thin film transistor of claim 1, wherein the first oxide dielectric layer is a metal oxide dielectric layer.

3. The thin film transistor of claim 2, wherein the metal oxide dielectric layer is an aluminum oxide ($Al_2O_3$) layer.

4. The thin film transistor of claim 1, wherein the first oxide dielectric layer is a silicon dioxide ($SiO_2$) layer.

5. The thin film transistor of claim 1, wherein a thickness of the dielectric layer is about 10 nanometers to about 1000 nanometers.

6. The thin film transistor of claim 1, wherein the at least one nano-scaled semiconductor material is selected from the group consisting of graphene, carbon nanotubes, molybdenum disulfide ($MoS_2$), tungsten disulfide ($WS_2$), manganese oxide ($MnO_2$), zinc oxide (ZnO), molybdenum selenide ($MoSe_2$), molybdenum(IV) telluride ($MoTe_2$), tantalum diselenide ($TaSe_2$), nickel telluride (NiTe), bismuth telluride ($Bi_2Te_3$), and combinations thereof.

7. The thin film transistor of claim 1, wherein the semiconductor layer comprises a plurality of nano-scaled semiconductor sheets stacked on one another.

8. The thin film transistor of claim 7, wherein a number of the plurality of nano-scaled semiconductor sheets is about 2 to 5.

9. The thin film transistor of claim 1, wherein the substrate comprises a material selected from a group consisting of glass, quartz, ceramics, diamond, and a combination thereof.

10. The thin film transistor of claim 1, wherein the substrate comprises a material selected from a group consisting of polyethylene terephthalate, polyethylene naphthalate, polyethylene terephthalate, polyimide, and a combination thereof.

11. The thin film transistor of claim 1, wherein the semiconductor layer comprises a single nano-scaled semiconductor sheet.

12. A method for making thin film transistor, the method comprising:
    providing a substrate;
    applying a semiconductor layer on the substrate, where the semiconductor layer comprises at least one nano-scaled semiconductor material;

forming a source and a drain on the substrate, wherein the source and the drain are spaced apart from each other and are electrically connected to the semiconductor layer forming a second sub-dielectric layer on the semiconductor layer, wherein forming the second sub-dielectric layer comprises growing a second oxide dielectric layer or a nitride dielectric layer by one of atomic layer deposition, electron beam evaporation, thermal oxidation, and plasma-enhanced chemical vapor deposition;

forming a first sub-dielectric layer on the second sub-dielectric layer by magnetron sputtering, wherein the first sub-dielectric layer is a first oxide dielectric layer; and depositing a gate, where the gate is in direct contact with the first oxide dielectric layer;

wherein the first oxide dielectric layer is grown by magnetron sputtering and sandwiched between the second sub-dielectric layer and the gate; and the current hysteresis caused by the first oxide dielectric layer is inverse to the current hysteresis caused by the second oxide dielectric layer or the nitride dielectric layer so that the thin film transistor has a reduced current hysteresis.

13. The method of claim 12, wherein forming the first sub-dielectric layer by magnetron sputtering further comprises growing a silicon dioxide ($SiO_2$) layer or an aluminum oxide ($Al_2O_3$) layer in a magnetron sputtering device.

14. The method of claim 13, wherein a vacuum of the magnetron sputtering device before the magnetron sputtering is less than $10^{-5}$ Pa.

15. The method of claim 14, wherein a distance between a sputtering target and the substrate is in a range of about 50 millimeters to bout 120 millimeters, a carrier gas is argon gas, a sputtering power is in a range of about 150 W to about 200 W, and a sputtering pressure is in a range of about 0.2 Pa to about 1 Pa during magnetron sputtering.

16. The method of claim 12, wherein applying the semiconductor layer further comprises depositing a plurality of semiconducting single-walled carbon nanotubes.

17. The method of claim 12, wherein applying the semiconductor layer further comprises depositing a plurality of molybdenum disulfide ($MoS_2$) sheets.

* * * * *